(12) United States Patent
Yang

(10) Patent No.: US 12,532,642 B2
(45) Date of Patent: Jan. 20, 2026

(54) DISPLAY PANEL AND MANUFACTURING METHOD THEREOF, AND DISPLAY DEVICE

(71) Applicant: Shanghai Tianma Microelectronics Co., Ltd., Shanghai (CN)

(72) Inventor: Zhenjun Yang, Shanghai (CN)

(73) Assignee: Shanghai Tianma Microelectronics Co., Ltd., Shanghai (CN)

( * ) Notice: Subject to any disclaimer, the term of this patent is extended or adjusted under 35 U.S.C. 154(b) by 544 days.

(21) Appl. No.: 18/070,964

(22) Filed: Nov. 29, 2022

(65) Prior Publication Data

US 2023/0091078 A1    Mar. 23, 2023

(30) Foreign Application Priority Data

Aug. 1, 2022   (CN) .......................... 202210916225.6

(51) Int. Cl.
  *H10K 59/80* (2023.01)
  *H10K 59/12* (2023.01)
  *H10K 71/00* (2023.01)

(52) U.S. Cl.
  CPC ....... *H10K 59/873* (2023.02); *H10K 59/8792* (2023.02); *H10K 71/00* (2023.02); *H10K 59/12* (2023.02)

(58) Field of Classification Search
  CPC .... H10K 50/844; H10K 50/865; H10K 71/00; H10K 59/12; H10K 59/8792; H10K 59/1201; H10K 59/873; G09F 9/335; G09F 9/35; H01L 21/47573; H10D 86/411; H10D 86/0212; H10D 86/60
  See application file for complete search history.

(56) References Cited

U.S. PATENT DOCUMENTS

2017/0012084 A1* 1/2017 Nakamura ........... H10K 50/805
2024/0315115 A1* 9/2024 Liu ........................ H10K 59/38

FOREIGN PATENT DOCUMENTS

CN           110459694 B      11/2021

* cited by examiner

*Primary Examiner* — J. E. Schoenholtz
(74) *Attorney, Agent, or Firm* — KDW FIRM PLLC

(57) ABSTRACT

Provided are a display panel and a manufacturing method thereof, and a display device, relating to the field of display technology. The display panel includes a display region and a non-display region. The non-display region is located at the periphery of the display region. The display panel includes a substrate, a first insulating film, and a second insulating film. The first insulating film is located in the display region and the non-display region and located on a side of the substrate. The edge of the first insulating film is located at a first cutoff position in the non-display region. The second insulating film is located in the display region and the non-display region and located on a side of the first insulating film facing away from the substrate. The edge of the second insulating film is located at the first cutoff position.

20 Claims, 19 Drawing Sheets

DISPLAY PANEL AND MANUFACTURING METHOD THEREOF, AND DISPLAY DEVICE

CROSS-REFERENCE TO RELATED APPLICATION(S)

This application claims priority to Chinese Patent Application No. 202210916225.6 filed Aug. 1, 2022, the disclosure of which is incorporated herein by reference in its entirety

TECHNICAL FIELD

The present disclosure relates to the field of display technology and, in particular, to a display panel and a manufacturing method thereof, and a display device.

BACKGROUND

With many advantages such as a thin body, power saving, and no radiation, a flat panel display device has been widely applied. The existing flat panel display device mainly includes a liquid crystal display device and an organic light-emitting display device. In a flat panel display device, what performs a display function is mainly a display panel.

When a display panel is prepared, a mask exposure process is usually used to form each film layer by layer.

SUMMARY

The present disclosure provides a display panel and a manufacturing method thereof, and a display device to reduce the process flow of the display panel in the manufacturing process, improve the production capacity of the display panel, and reduce the manufacturing cost of the display panel.

In a first aspect, an embodiment of the present disclosure provides a display panel. The display panel includes a display region and a non-display region. The non-display region is located at the periphery of the display region. The display panel includes a substrate, a first insulating film, and a second insulating film.

The first insulating film is located in the display region and the non-display region and located on a side of the substrate. The edge of the first insulating film is located at a first cutoff position in the non-display region.

The second insulating film is located in the display region and the non-display region and located on the side of the first insulating film facing away from the substrate. The edge of the second insulating film is located at the first cutoff position.

In a second aspect, an embodiment of the present disclosure provides a manufacturing method of a display panel. The display panel includes a display region and a non-display region. The non-display region is located at the periphery of the display region. The method includes the steps below.

The substrate is provided.

A first initial film covering the display region and the non-display region is formed.

The second insulating film covering the display region and the non-display region is formed. The edge of the second insulating film is located at the first cutoff position in the non-display region.

The second insulating film is used as a mask. At least part of the first initial film in the non-display region is etched and removed to form the first insulating film. The edge of the first insulating film is located at the first cutoff position.

In a third aspect, an embodiment of the present disclosure provides a display device. The device includes the display panel described in the first aspect.

DETAILED DESCRIPTION

Figure 1:
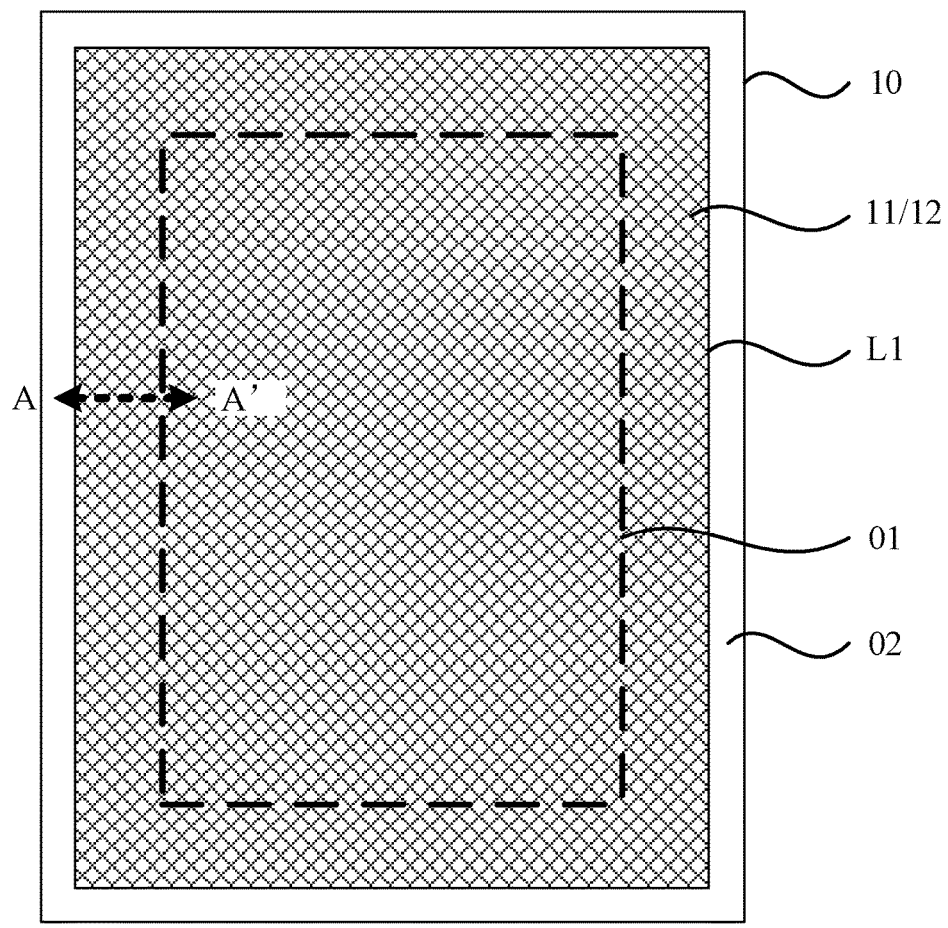
FIG. 1 is a top view of a display panel according to an embodiment of the present disclosure.

Hereinafter the present disclosure is further described in detail in conjunction with the drawings and embodiments. It is to be understood that the specific embodiments set forth below are intended to illustrate and not to limit the present disclosure. Additionally, it is to be noted that, for ease of description, only part, not all, of structures related to the present disclosure are illustrated in the drawings.

Figure 2:
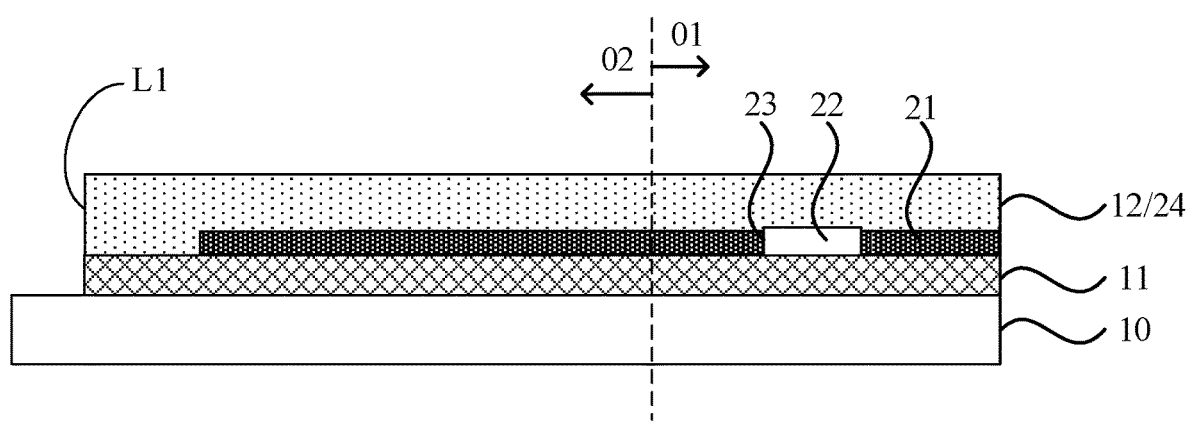
FIG. 2 is a section view taken along section line AA' of FIG. 1.

FIG. 1 is a top view of a display panel according to an embodiment of the present disclosure. FIG. 2 is a section view taken along section line AA' of FIG. 1. Referring to FIGS. 1 and 2, the display panel includes a display region 01 (the region inside the dashed box in FIG. 1) and a non-display region 02 (a region outside the dashed box in FIG. 1). The non-display region 02 is located at the periphery of the display region 01. The display panel includes a substrate 10, a first insulating film 11, and a second insulating film 12. The first insulating film 11 is located in the display region 01 and the non-display region 02. The first insulating film 11 is located on a side of the substrate 10. The edge of the first insulating film 11 is located at a first cutoff position L1 in the non-display region 02. That is, the first insulating film 11 extends from the display region 01 to the non-display region 02 and is cut off at the first cutoff position L1 in the non-display region 02. The second insulating film 12 is located in the display region 01 and the non-display region 02. The second insulating film 12 is located on the side of the first insulating film 11 facing away from the substrate 10. The edge of the second insulating film 12 is located at the first cutoff position. That is, the second insulating film 12 covers the first insulating film 11. The second insulating film 12 extends from the display region 01 to the non-display region 02 and is similarly cut off at the first cutoff position L1 in the non-display region 02.

In the display panel provided by this embodiment of the present disclosure, the first insulating film 11 and the second insulating film 12 are each cut off at the first cutoff position L1 in the non-display region 02, and the edge of the first insulating film 11 and the edge of the second insulating film 12 are flush. In this manner, during the manufacturing process of the display panel, when a first initial film is etched to form the first insulating film 11, the second insulating film 12 may be used as a mask for etching the first initial film. Thus, there is no need to specially manufacture a mask when the first initial film is etched, so that a process is saved, and the process flow of the display panel in the manufacturing process is reduced. Moreover, the production capacity of the display panel is improved, and the manufacturing cost of the display panel is reduced.

Figure 3:
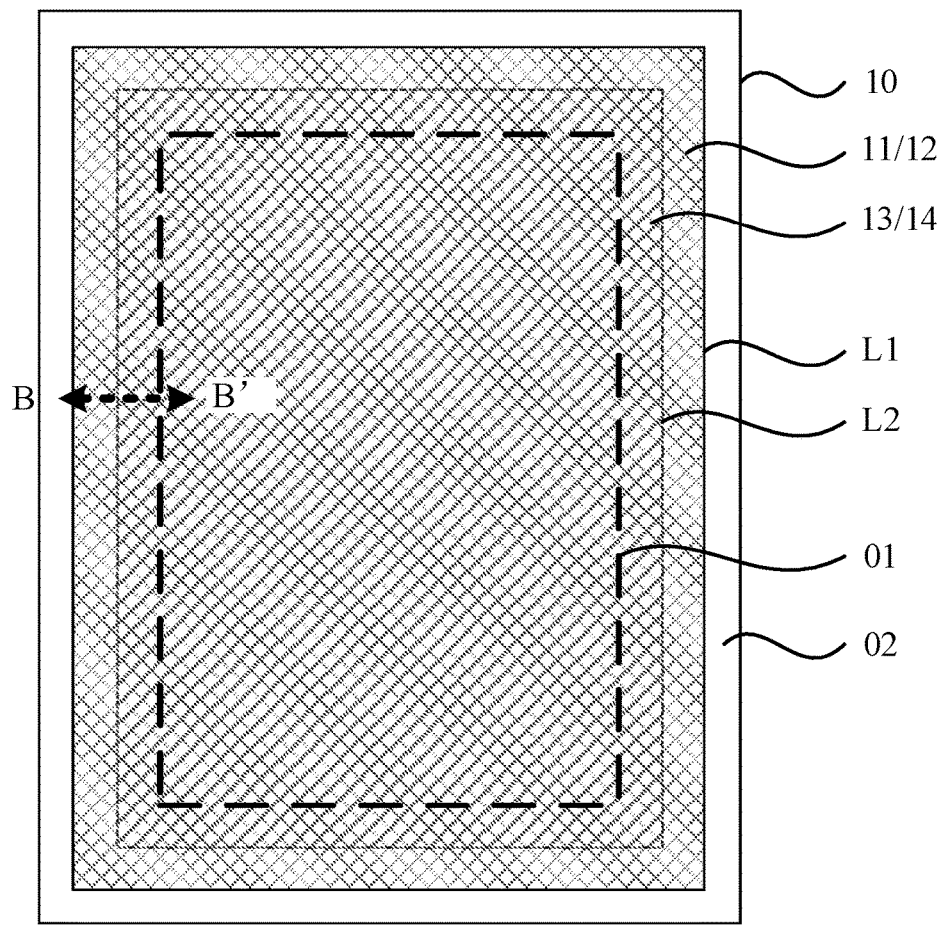
FIG. 3 is a top view of another display panel according to an embodiment of the present disclosure.
Figure 4:
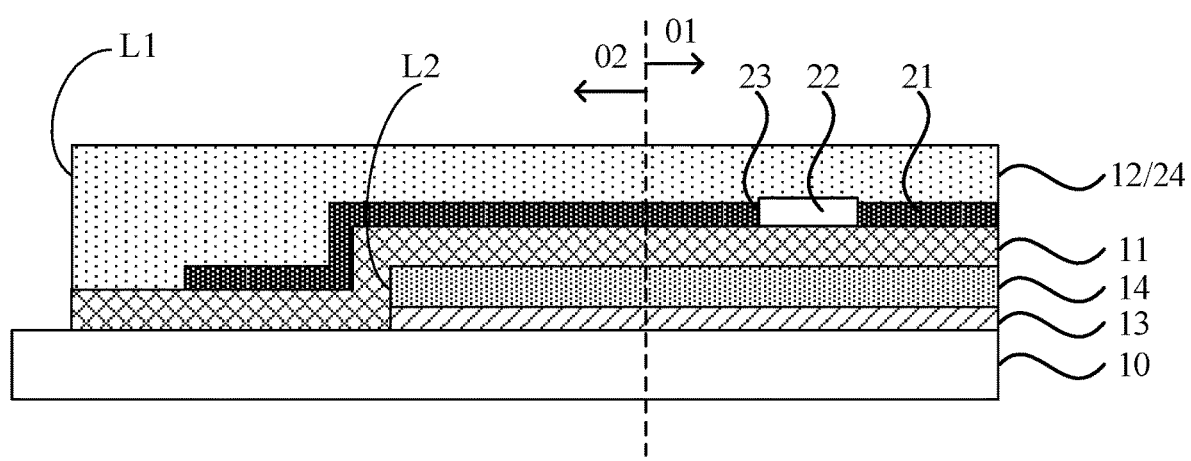
FIG. 4 is a section view taken along section line BB' of FIG. 3.

FIG. 3 is a top view of another display panel according to an embodiment of the present disclosure. FIG. 4 is a section view taken along section line BB' of FIG. 3. Referring to FIGS. 3 and 4, the display panel also includes a third insulating film 13 and a fourth insulating film 14. The third insulating film 13 is located in the display region 01 and the non-display region 02. The third insulating film 13 is located between the first insulating film 11 and the substrate 10. The edge of the third insulating film 13 is located at a second cutoff position L2 in the non-display region 02. That is, the third insulating film 13 extends from the display region 01 to the non-display region 02 and is cut off at the second cutoff position L2 in the non-display region 02. The fourth insulating film 14 is located in the display region 01 and the non-display region 02. The fourth insulating film 14 is located between the third insulating film 13 and the first insulating film 11. The edge of the fourth insulating film 14 is located at the second cutoff position L2. That is, the fourth insulating film 14 covers the third insulating film 13. The fourth insulating film 14 extends from the display region 01 to the non-display region 02 and is similarly cut off at the second cutoff position L2 in the non-display region 02. In this embodiment of the present disclosure, the third insulating film 13 and the fourth insulating film 14 are each cut off at the second cutoff position L2 in the non-display region 02, and the edge of the third insulating film 13 and the edge of the fourth insulating film 14 are flush. In this manner, during the manufacturing process of the display panel, when a second initial film is etched to form the third insulating film 13, the fourth insulating film 14 may be used as a mask for etching the second initial film, so that a process is saved.

For example, referring to FIGS. 3 and 4, the second cutoff position L2 is located between the first cutoff position L1 and the display region 01. The edge of the first insulating film 11 and the edge of the second insulating film 12 are further away from the display region 01 than the edge of the third insulating film 13 and the edge of the fourth insulating film 14. Thus, the first insulating film 11 and the second insulating film 12 located in an upper layer may cover the edge of the third insulating film 13 and the edge of the fourth insulating film 14 located in a lower layer to seal the edge of the third insulating film 13 and the edge of the fourth insulating film 14. In this manner, vapor and oxygen are prevented from entering the display region 01 of the display panel from the edge of the third insulating film 13 and the edge of the fourth insulating film 14.

In an embodiment, referring to FIGS. 1 to 4, the first insulating film 11 includes an inorganic layer. The first insulating film 11 includes an inorganic material. The second insulating film 12 includes an organic layer. The second insulating film 12 includes an organic material. In this embodiment of the present disclosure, the second insulating film 12 including the organic material is used as the mask to form the first insulating film 11 including the inorganic material by etching.

In another embodiment, the first insulating film 11 may include an organic layer, and the second insulating film 12 may include an organic layer.

In another embodiment, the first insulating film 11 may include an organic layer, and the second insulating film 12 may include an inorganic layer.

In another embodiment, the first insulating film 11 may include an inorganic layer, and the second insulating film 12 may include an inorganic layer.

For example, referring to FIGS. 3 and 4, the third insulating film 13 and the fourth insulating film 14 each includes an inorganic layer, or the third insulating film 13 and the fourth insulating film 14 each includes an organic layer. During the manufacturing process of the display panel, the same etching method may be used for the third insulating film 13 and the fourth insulating film 14 of the same material type. For example, dry etching is used for an inorganic layer, and an exposure and development method is used for an organic layer. In this manner, during the manufacturing process of the display panel, the same mask is used, and in the same process, the third insulating film 13 and the fourth insulating film 14 are simultaneously formed, so that a process is saved.

In an embodiment, referring to FIGS. 2 and 4, the display panel also includes a black matrix 21 and multiple color resists 22. The black matrix 21 is located in the display region 01 and the non-display region 02. The black matrix 21 is formed with multiple openings 23 (one opening 23 is used as an example in FIG. 2 and FIG. 4). The openings 23 are located in the display region 01. The color resists 22 are located in the openings 23. The multiple color resists 22 are located in the multiple openings 23 separately. The multiple color resists 22 are each located in the display region 01. The black matrix 21 includes an opaque material configured to block light transmission. The color resist 22 is configured to selectively filter the light transmitting the color resist 22. For example, the multiple color resists 22 may include red color resists, green color resists, and blue color resists. A red resist is configured to filter the light transmitting the red resist into red. A green resist is configured to filter the light transmitting the green resist into green. A blue resist is configured to filter the light transmitting the blue resist into blue. The black matrix 21 and the color resists 22 are located between the first insulating film 11 and the second insulating film 12. The second insulating film 12 covers the black matrix 21 and the color resists 22. In this manner, when the second insulating film 12 is used as the mask to etch the first initial film to form the first insulating film 11, the second insulating film 12 may protect the black matrix 21 and the color resists 22 to prevent the black matrix 21 and the color resists 22 from being etched and thinned.

For example, referring to FIGS. 2 and 4, the display panel includes a planarization layer 24. The planarization layer 24 is configured to cover and protect the black matrix 21 and the multiple color resists 22. The second insulating film 12 is the planarization layer 24 in the display panel. It is to be noted that the planarization layer 24 indicates that the film is an organic layer and has a certain planarization effect. The material of the planarization layer 24 is not limited. In an embodiment, the planarization layer includes an adhesive layer.

Figure 5:
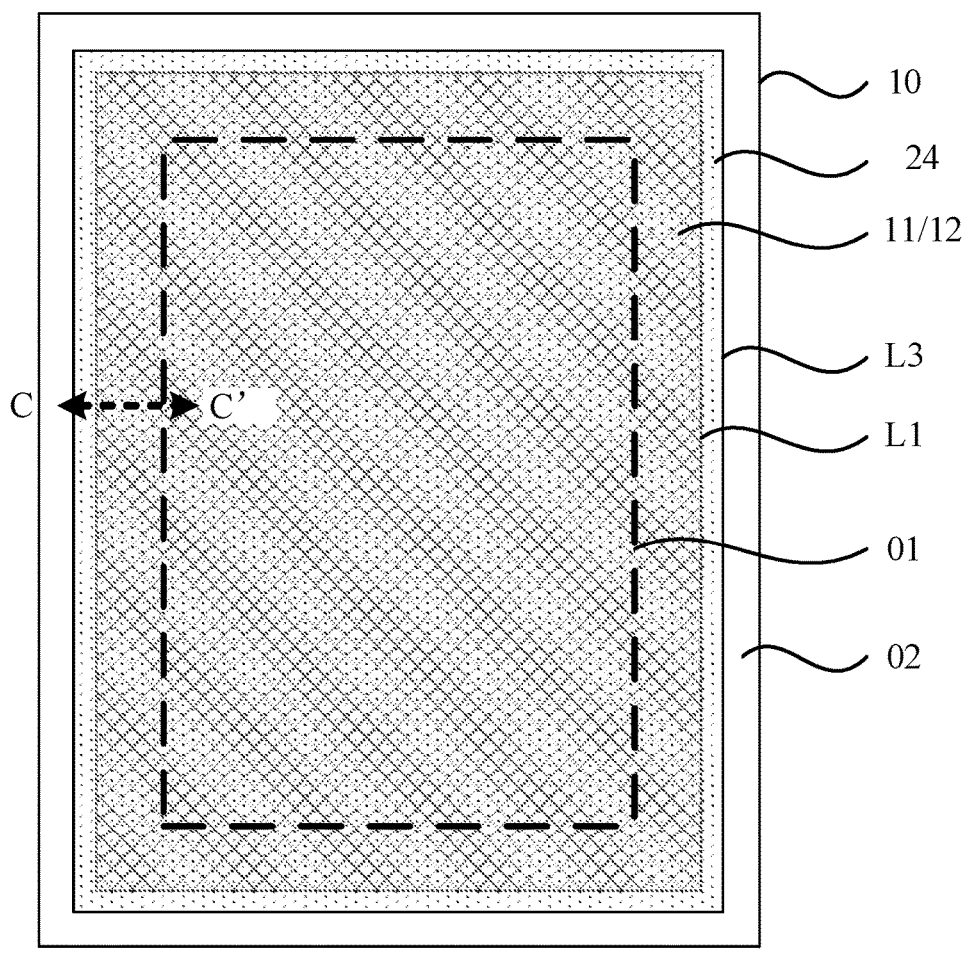
FIG. 5 is a top view of another display panel according to an embodiment of the present disclosure.
Figure 6:
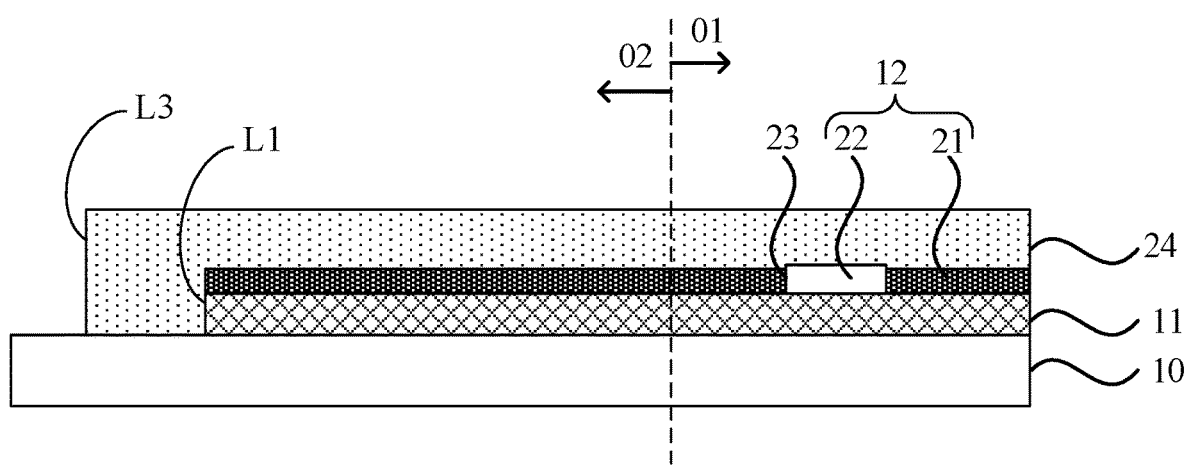
FIG. 6 is a section view taken along section line CC' of FIG. 5.

FIG. 5 is a top view of another display panel according to an embodiment of the present disclosure. FIG. 6 is a section view taken along section line CC' of FIG. 5. Referring to FIGS. 5 and 6, the second insulating film 12 includes a black matrix 21 and multiple color resists 22. The black matrix 21 is located in the display region 01 and the non-display region 02. The black matrix 21 is formed with multiple openings 23. The openings 23 are located in the display region 01. The color resists 22 are located in the openings 23. In this embodiment of the present disclosure, a combined structure formed by the black matrix 21 and the multiple color resists 22 is used as the second insulating film 12, so that the edge of the black matrix 21 is located at the first cutoff position L1 in the non-display region 02. The edge of the black matrix 21 is flush with the edge of the first insulating film 11.

In an embodiment, referring to FIGS. 5 and 6, the display panel also includes a planarization layer 24. The planarization layer 24 is located in the display region 01 and the non-display region 02. The planarization layer 24 is located on the side of the second insulating film 12 facing away from the substrate 10. The planarization layer 24 is configured to cover and protect the black matrix 21 and the multiple color resists 22.

In an embodiment, referring to FIGS. 5 and 6, the edge of the planarization layer 24 is located at a third cutoff position L3 in the non-display region 02. The first cutoff position L1 is located between the third cutoff position L3 and the display region 01. The edge of the planarization layer 24 is further away from the display region 01 than the edge of the first insulating film 11. In this manner, the planarization layer 24 located in an upper layer may cover the edge of the first insulating film 11 located in a lower layer to seal the edge of the first insulating film 11, thereby preventing vapor and oxygen from entering the display region 01 of the display panel from the edge of the first insulating film 11.

Figure 7:
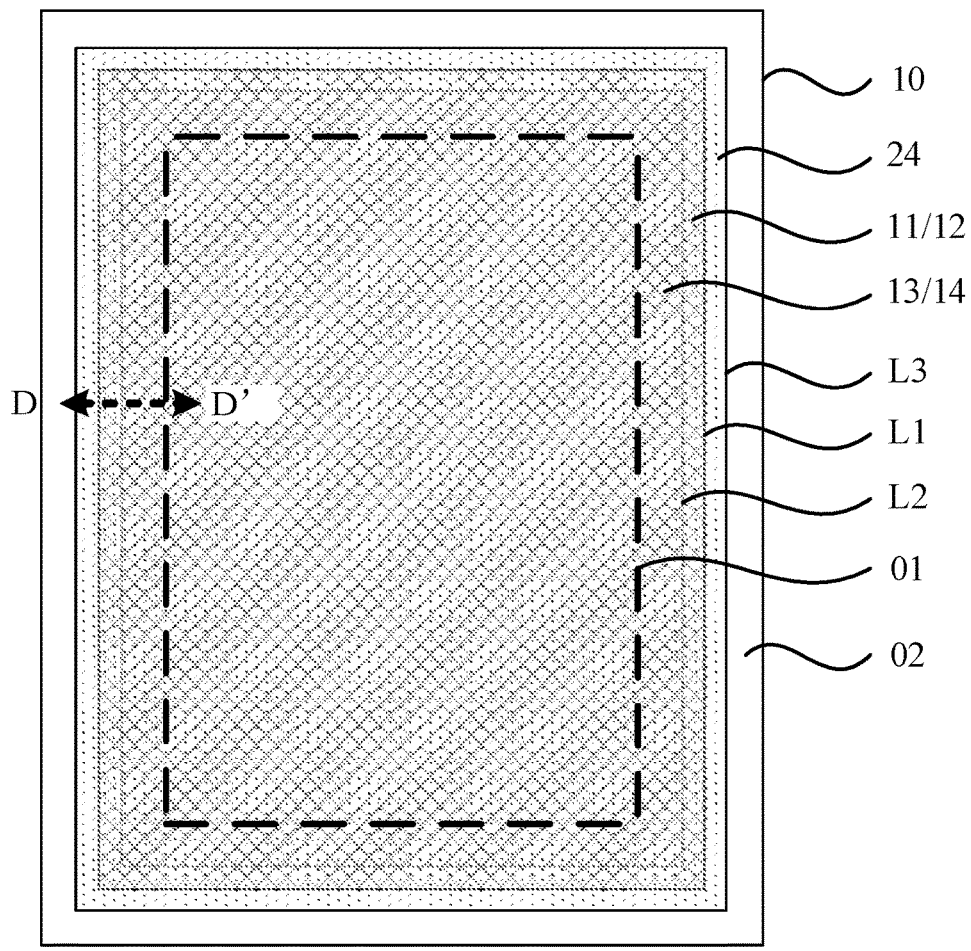
FIG. 7 is a top view of another display panel according to an embodiment of the present disclosure.
Figure 8:
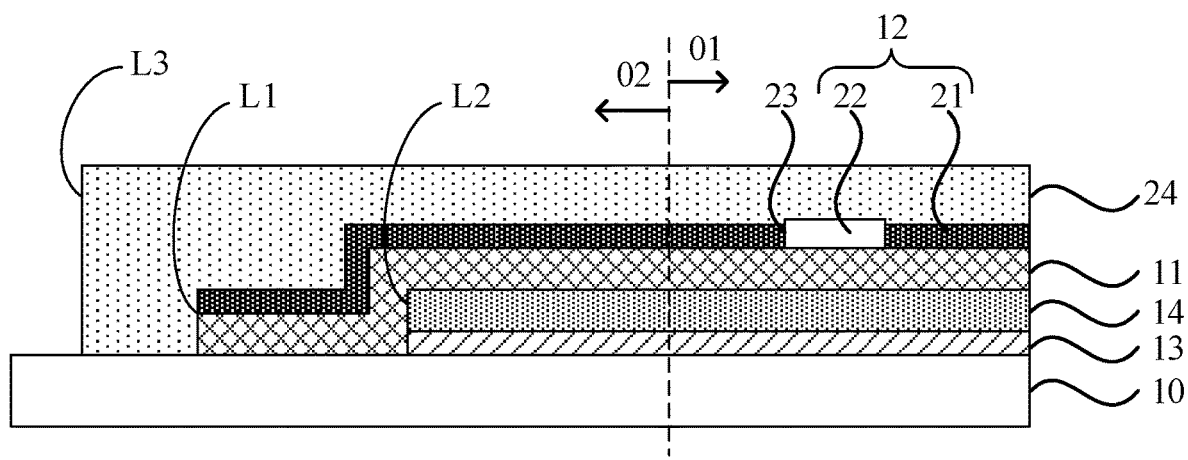
FIG. 8 is a section view taken along section line DD' of FIG. 7.

FIG. 7 is a top view of another display panel according to an embodiment of the present disclosure. FIG. 8 is a section view taken along section line DD' of FIG. 7. Referring to FIGS. 7 and 8, the display panel also includes a third insulating film 13 and a fourth insulating film 14. The third insulating film 13 is located between the first insulating film 11 and the substrate 10. The fourth insulating film 14 is located between the first insulating film 11 and the third insulating film 13. The edge of the third insulating film 13 and the edge of the fourth insulating film 14 are each located at the second cutoff position L2 in the non-display region 02. The second cutoff position L2 is located between the first cutoff position L1 and the display region 01. The first cutoff position L1 is located between the second cutoff position L2 and the third cutoff position L3.

Figure 9:
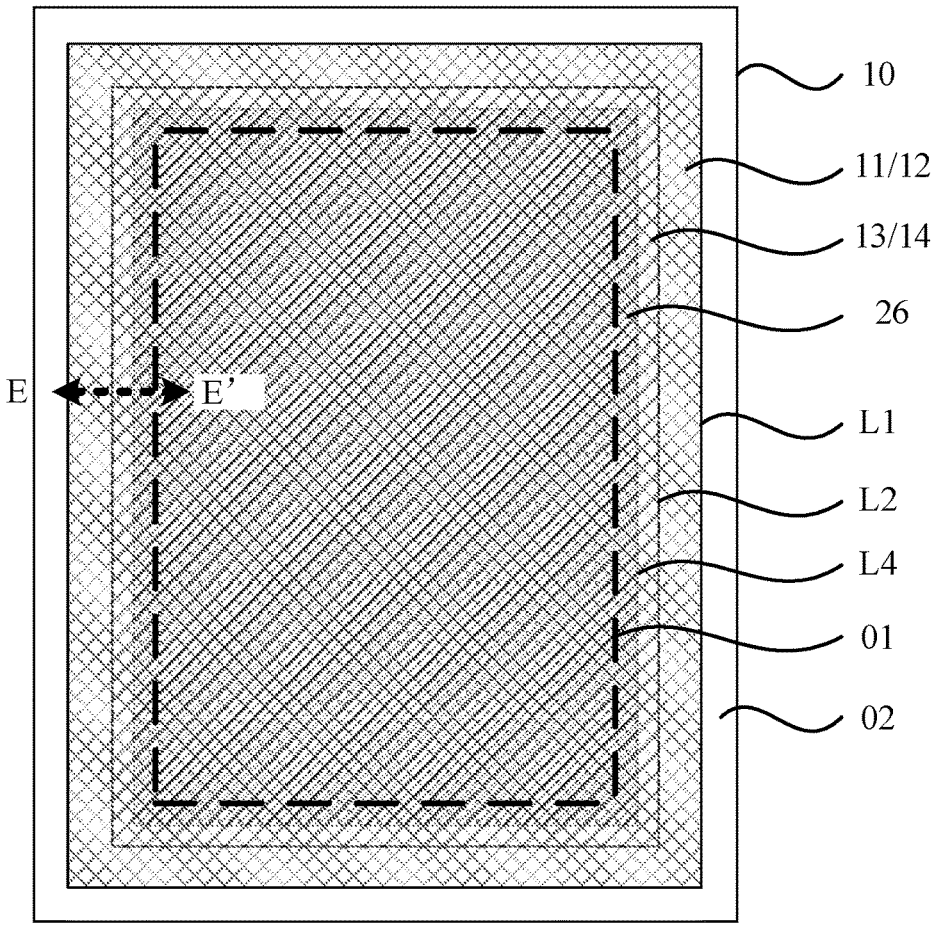
FIG. 9 is a top view of another display panel according to an embodiment of the present disclosure.
Figure 10:
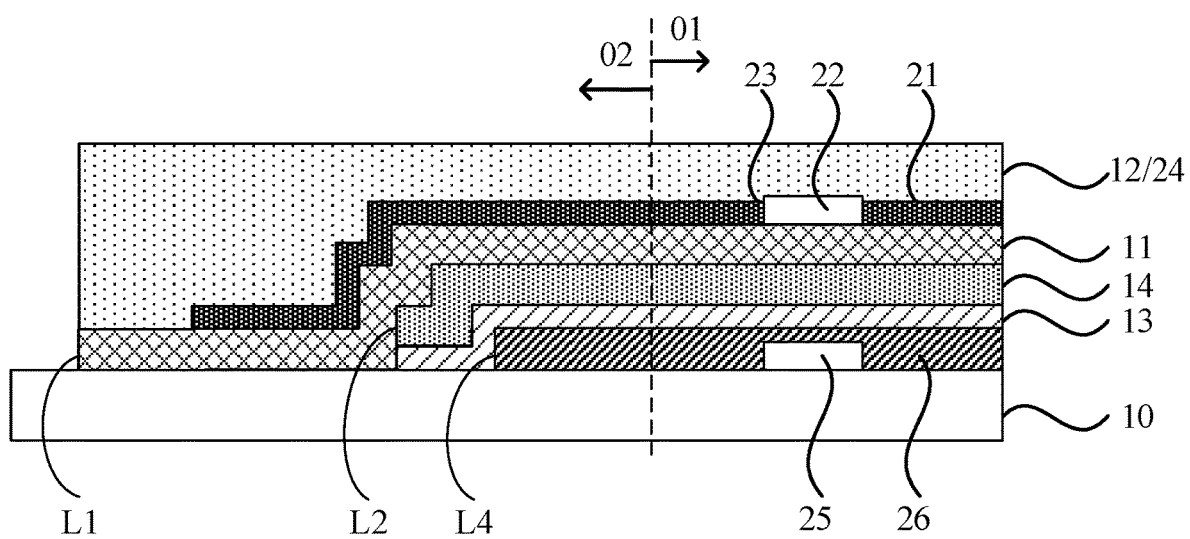
FIG. 10 is a section view taken along section line EE' of FIG. 9.

FIG. 9 is a top view of another display panel according to an embodiment of the present disclosure. FIG. 10 is a section view taken along section line EE' of FIG. 9. Referring to FIGS. 9 and 10, the display panel also includes a display function layer 25 and a thin-film encapsulation layer 26. The display function layer 25 is located in the display region 01. The display function layer 25 is located between the substrate 10 and the third insulating film 13. The thin-film encapsulation layer 26 is located in the display region 01 and the non-display region 02. The thin-film encapsulation layer 26 is located between the display function layer 25 and the third insulating film 13. The thin-film encapsulation layer 26 covers and seals the display function layer 25 and is configured to prevent vapor and oxygen from eroding the display function layer 25. The edge of an inorganic layer in the thin-film encapsulation layer 26 (generally, the edge of the inorganic layer in the thin-film encapsulation layer 26 is the edge of the thin-film encapsulation layer 26) is located at a fourth cutoff position L4 in the non-display region 02. The thin-film encapsulation layer 26 includes at least one inorganic layer. The fourth cutoff position L4 is the furthest cutoff position where the inorganic layer in the thin-film encapsulation layer 26 extends. The fourth cutoff position L4 is located between the second cutoff position L2 and the display region 01. The edge of the third insulating film 13 and the edge of the fourth insulating film 14 are further away from the display region 01 than the edge of the inorganic layer in the thin-film encapsulation layer 26. In this manner, the third insulating film 13 and the fourth insulating film 14 located in an upper layer may cover the edge of the inorganic layer in the thin-film encapsulation layer 26 located in a lower layer to seal the edge of the inorganic layer in the thin-film encapsulation layer 26, thereby preventing vapor and oxygen from entering the display region 01 of the display panel from the edge of the inorganic layer in the thin-film encapsulation layer 26.

For example, referring to FIGS. 9 and 10, the second cutoff position L2 is located between the first cutoff position L1 and the fourth cutoff position L4. The fourth cutoff position L4 is located between the second cutoff position L2 and the display region 01. The first insulating film 11 and the second insulating film 12 cover the edge of the third insulating film 13 and the edge of the fourth insulating film 14. The third insulating film 13 and the fourth insulating film 14 cover the edge of the inorganic layer in the thin-film encapsulation layer 26.

Figure 11:
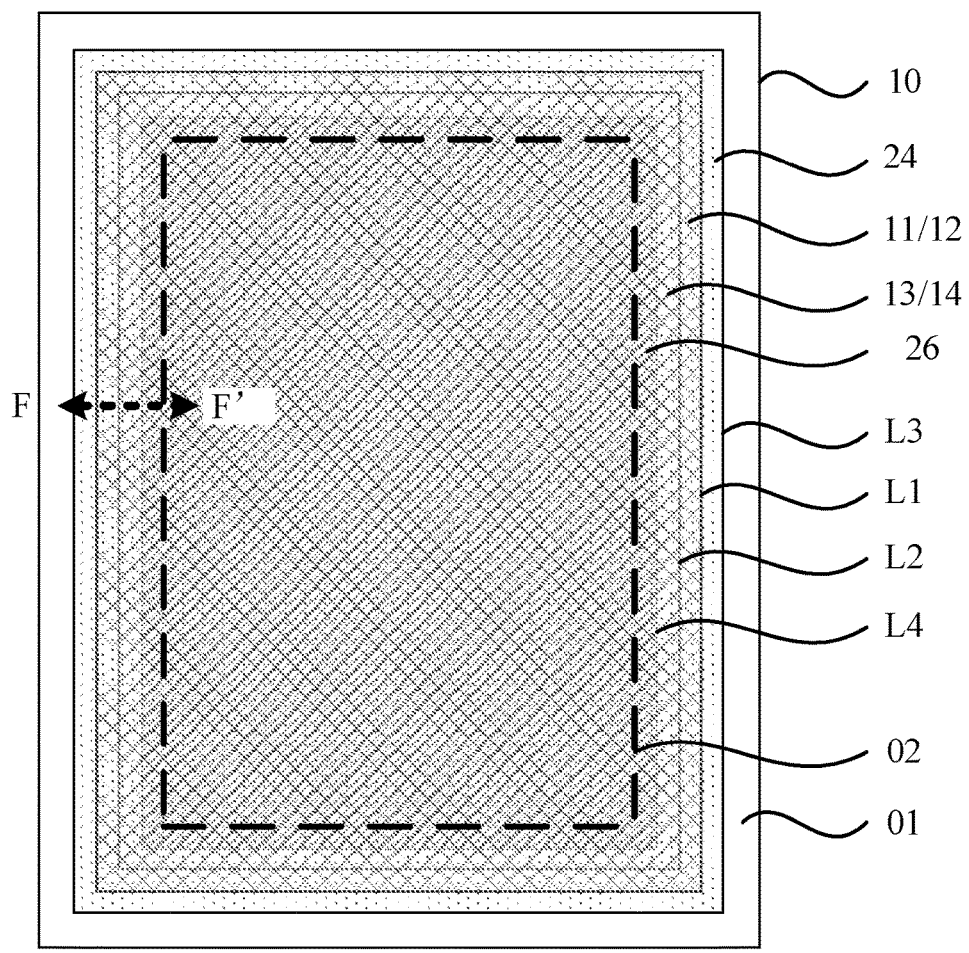
FIG. 11 is a top view of another display panel according to an embodiment of the present disclosure.
Figure 12:
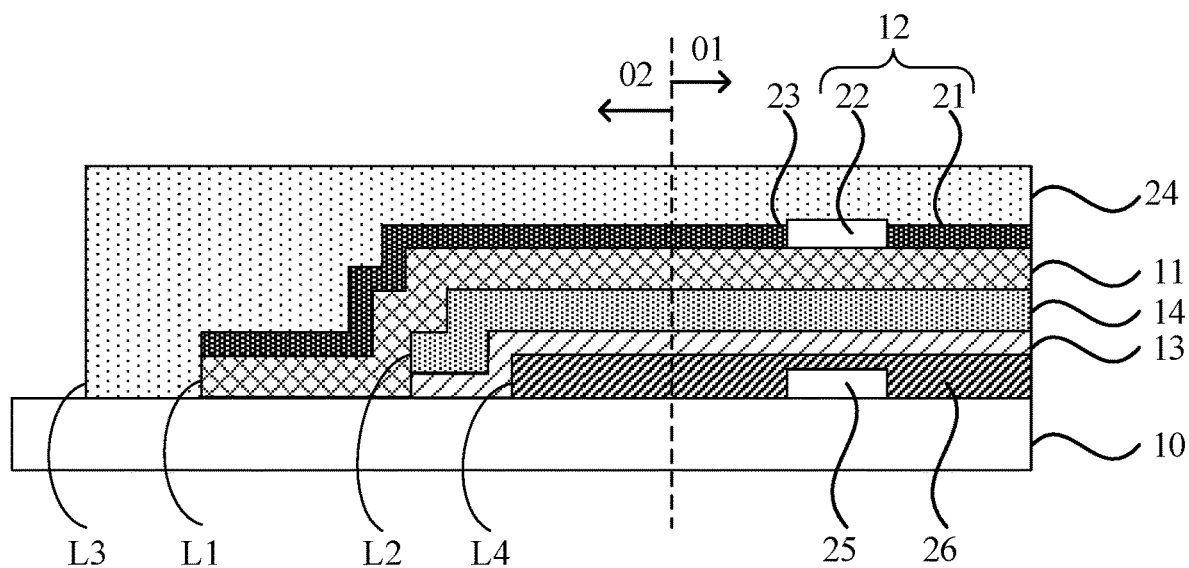
FIG. 12 is a section view taken along section line FF' of FIG. 11.

FIG. 11 is a top view of another display panel according to an embodiment of the present disclosure. FIG. 12 is a section view taken along section line FF' of FIG. 11. Referring to FIGS. 11 and 12, the second cutoff position L2 is located between the first cutoff position L1 and the fourth cutoff position L4. The fourth cutoff position L4 is located between the second cutoff position L2 and the display region 01. The first cutoff position L1 is located between the second cutoff position L2 and the third cutoff position L3. The planarization layer 24 covers the edge of the first insulating film 11 and the edge of the second insulating film 12. The first insulating film 11 and the second insulating film 12 cover the edge of the third insulating film 13 and the edge of the fourth insulating film 14. The third insulating film 13 and the fourth insulating film 14 cover the edge of the inorganic layer in the thin-film encapsulation layer 26.

Figure 13:
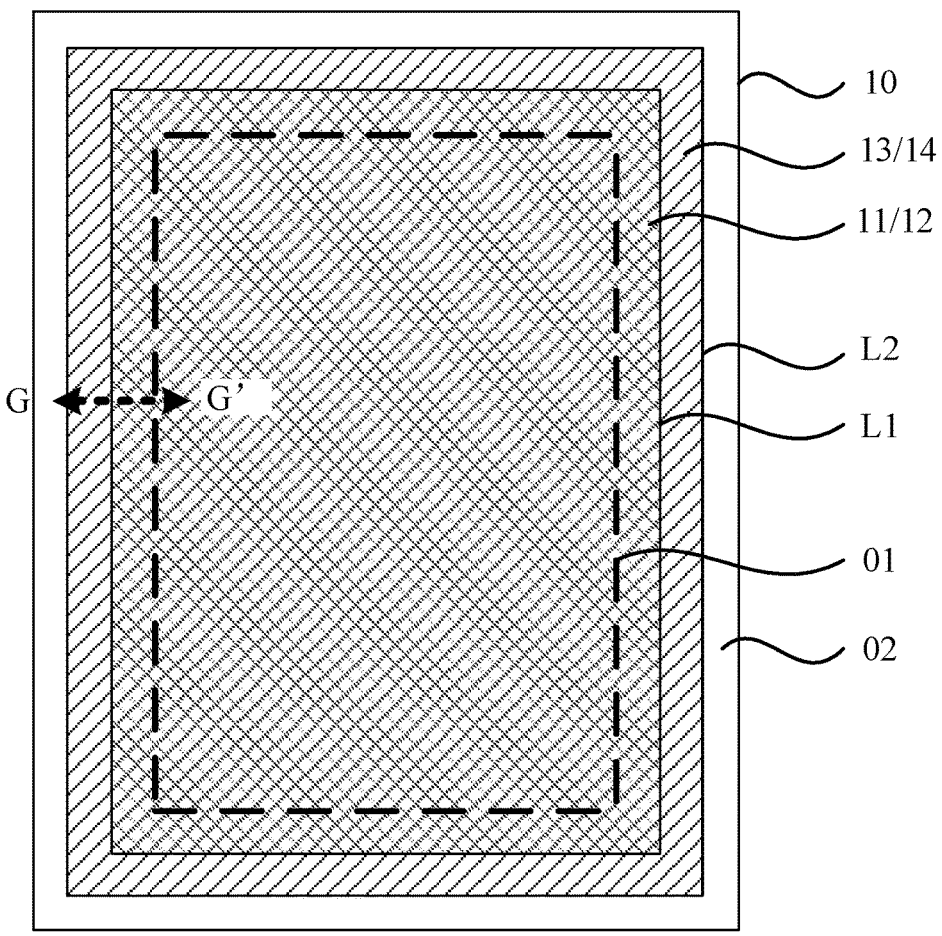
FIG. 13 is a top view of another display panel according to an embodiment of the present disclosure.
Figure 14:
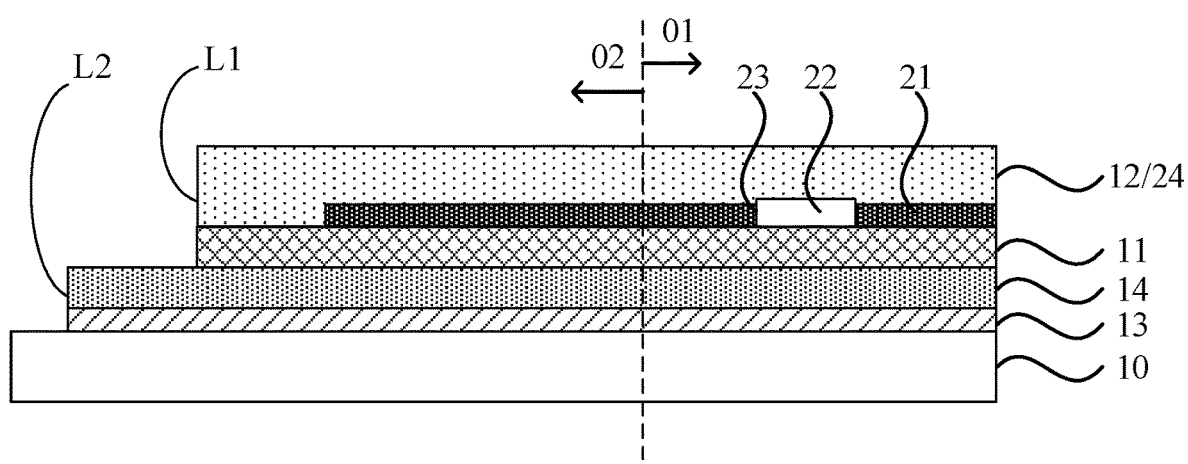
FIG. 14 is a section view taken along section line GG' of FIG. 11.

FIG. 13 is a top view of another display panel according to an embodiment of the present disclosure. FIG. 14 is a section view taken along section line GG' of FIG. 11. Referring to FIGS. 13 and 14, the first cutoff position L1 is located between the second cutoff position L2 and the display region 01. The edge of the third insulating film 13 and the edge of the fourth insulating film 14 are further away from the display region 01 than the edge of the first insulating film 11 and the edge of the second insulating film 12. In this manner, the first insulating film 11 and the second insulating film 12 located in an upper layer expose the third insulating film 13 and the fourth insulating film 14 located in a lower layer. The exposed third insulating film 13 and the exposed fourth insulating film 14 may be used as a protective layer to prevent the film located in the region between the first cutoff position L1 and the second cutoff position L2 and located below the third insulating film 13 from being damaged when the first insulating film 11 is formed by etching.

Figure 15:
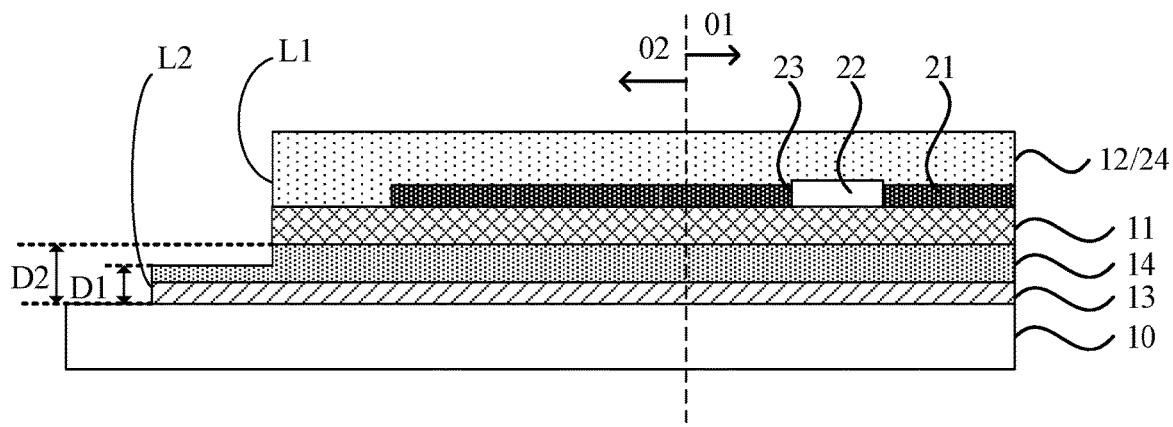
FIG. 15 is a section view of another display panel according to an embodiment of the present disclosure.

FIG. 15 is a section view of another display panel according to an embodiment of the present disclosure. Referring to FIG. 15, the region between the first cutoff position L1 and the second cutoff position L2 is an over-etching region. In the direction perpendicular to the plane in which the substrate 10 is located, the sum of the thickness of the third insulating film 13 and the thickness the fourth insulating film 14 in the over-etching region is D1. In the direction perpendicular to the plane in which the substrate 10 is located, the sum of the thickness of the third insulating film 13 and the thickness the fourth insulating film 14 in the display region is D2. D1 is smaller than D2. In this embodiment of the present disclosure, due to the over etching of the first initial film when the first insulating film 11 is formed, the fourth insulating film 14 of a partial thickness in the over-etching region is etched off. Alternatively, the fourth insulating film 14 of the full thickness is etched off. Alternatively, the fourth insulating film 14 of the full thickness and the third insulating film 13 of a partial thickness are etched off.

Figure 16:
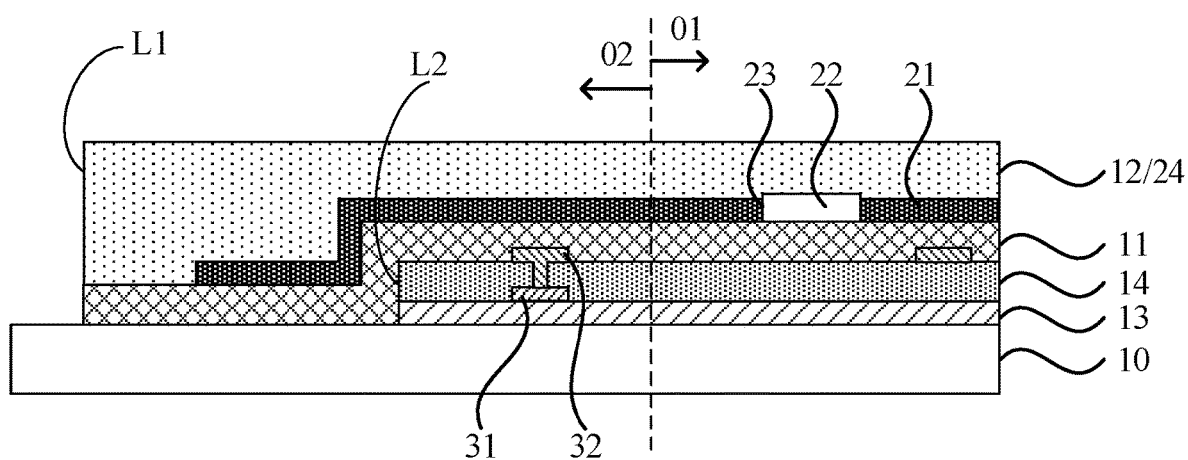
FIG. 16 is a section view of another display panel according to an embodiment of the present disclosure.

FIG. 16 is a section view of another display panel according to an embodiment of the present disclosure. Referring to FIG. 16, the display panel also includes a first touch metal layer 31 and a second touch metal layer 32. The first touch metal layer 31 is located between the third insulating film 13 and the fourth insulating film 14. The second touch metal layer 32 is located between the fourth insulating film 14 and the first insulating film 11.

For example, referring to FIG. 16, the third insulating film 13 is a buffer layer configured to prevent vapor during the process from entering the display device and match the stress of the thin-film encapsulation. The fourth insulating film 14 is a touch insulating layer configured to space the first touch metal layer 31 and the second touch metal layer 32. The first insulating film 11 is a touch insulating layer configured to cover the second touch metal layer 32. In an embodiment, referring to FIG. 16, the second insulating film 12 is an organic layer, and the first insulating film 11 is an inorganic layer. In one aspect, the second insulating film 12 may protect the black matrix 21 and the multiple color resists 22. In another aspect, the second insulating film is used as the mask to etch the first initial film to form the first insulating film 11, that is, the protective layer (the second insulating film 12) of the black matrix 21 and the multiple color resists 22 on a side facing away from the substrate is used as a mask to form a touch insulating layer (the first insulating film 11) by etching. Thus, there is no need to specially manufacture a mask when the first initial film 110 is etched, so that a process is saved, and the process flow of the display panel in the manufacturing process is reduced. Moreover, the production capacity of the display panel is improved, and the manufacturing cost of the display panel is reduced.

For example, referring to FIG. 16, the second touch metal layer 32 may include multiple touch electrodes, which may be self-capacitive touch electrodes or mutual capacitive touch electrodes. The first touch metal layer 31 may include a touch electrode wire connected to the touch electrodes. In the case where the multiple touch electrodes are mutual capacitive touch electrodes, the first touch metal layer 31 may include a bridge configured to connect two adjacent touch electrodes.

Figure 17:
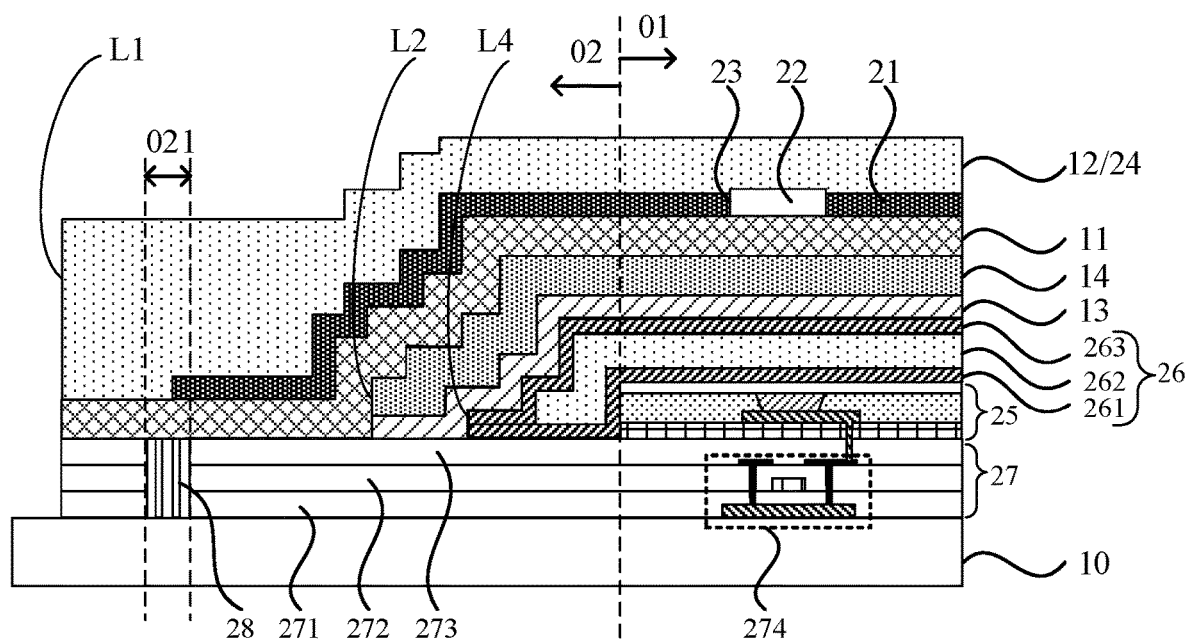
FIG. 17 is a section view of another display panel according to an embodiment of the present disclosure.

FIG. 17 is a section view of another display panel according to an embodiment of the present disclosure. Referring to FIG. 17, the display panel includes a display function layer 25 and a driver circuit layer 27. The display function layer 25 is located in the display region 01. The display function layer 25 is located between the substrate 10 and the first insulating film 11. The driver circuit layer 27 is located in the display region 01 and the non-display region 02. An inorganic layer in the driver circuit layer 27 is also formed with multiple grooves 28 in the non-display region 02. The region in which a groove 28 is located is a groove region 021. The groove 28 can prevent the cutting crack generated in the inorganic layer of the driver circuit layer 27 from being conducted toward the display region 01 when the display panel is cut. The second insulating film 12 is the planarization layer 24. The groove region 021 is located between the first cutoff position L1 and the display region 01. The second insulating film 12 covers the entire region of the groove region 021. In an embodiment, the groove 28 may be filled with an organic layer (not shown in the figure).

Figure 18:
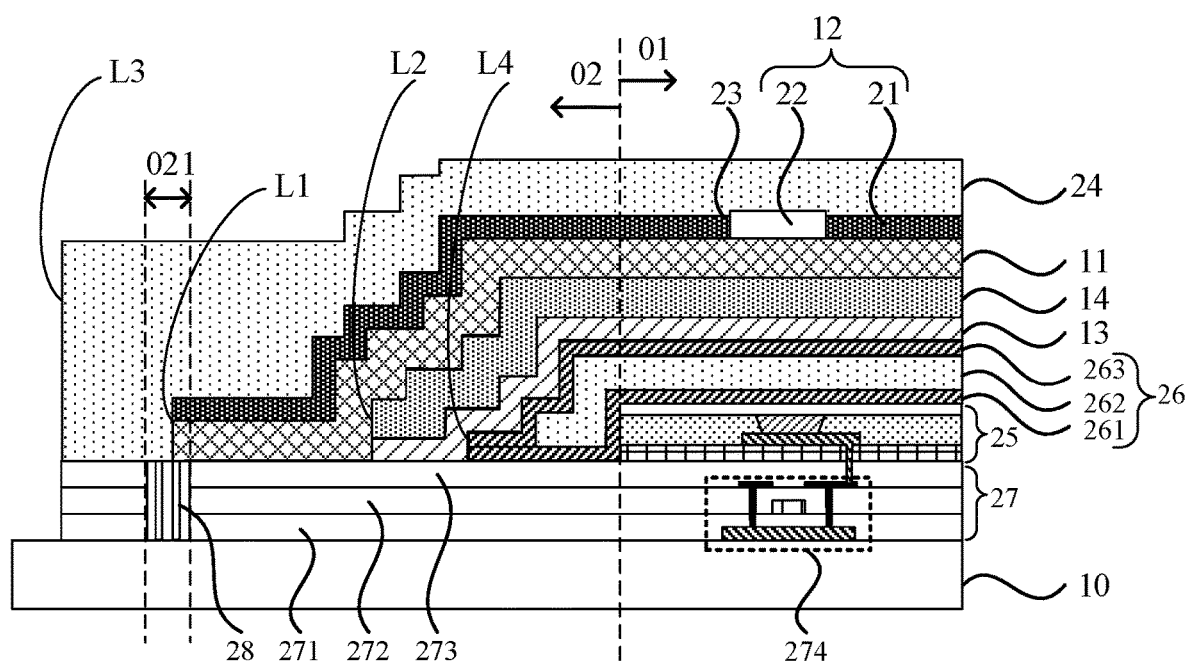
FIG. 18 is a section view of another display panel according to an embodiment of the present disclosure.

FIG. 18 is a section view of another display panel according to an embodiment of the present disclosure. Referring to FIG. 18, the display panel includes a display function layer 25 and a driver circuit layer 27. The display function layer 25 is located in the display region 01. The display function layer 25 is located between the substrate 10 and the first insulating film 11. The driver circuit layer 27 is located in the display region 01 and the non-display region 02. The inorganic layer in the driver circuit layer 27 is also formed with multiple grooves 28 in the non-display region 02. The region in which a groove 28 is located is a groove region 021. The second insulating film 12 is a combined structure formed by the black matrix 21 and the multiple color resists 22. The first cutoff position L1 is located in the groove region 021. The second insulating film 12 covers a partial region of the groove region 021.

For example, referring to FIGS. 17 and 18, the driver circuit layer 27 includes multiple thin-film transistors 274 (only one thin-film transistor 274 is illustrated in FIGS. 17 and 18). The thin-film transistor 274 may include a source, a gate, a drain and a semiconductor layer. The driver circuit layer 27 may also include a gate insulating layer 271, an interlayer insulating layer 272, and a source-drain passivation layer 273 stacked in sequence in a direction perpendicular to the substrate 10. The groove 28 is formed in the non-display region 02 by the gate insulating layer 271, the interlayer insulating layer 272, and the source-drain passivation layer 273.

For example, referring to FIGS. 17 and 18, the thin-film encapsulation layer 26 includes a first inorganic encapsulation layer 261, an organic encapsulation layer 262 and a second inorganic encapsulation layer 263. The organic encapsulation layer 262 is located between the first inorganic encapsulation layer 261 and the second inorganic encapsulation layer 263. The second inorganic encapsulation layer 263 covers the edge of the organic encapsulation layer 262 to prevent vapor and oxygen from entering the organic encapsulation layer 262. The edge of the first inorganic encapsulation layer 261 and the edge of the second inorganic encapsulation layer 263 are each located at the fourth cutoff position L4. The edge of the thin-film encapsulation layer 26 is also located at the fourth cutoff position L4.

Figure 19:
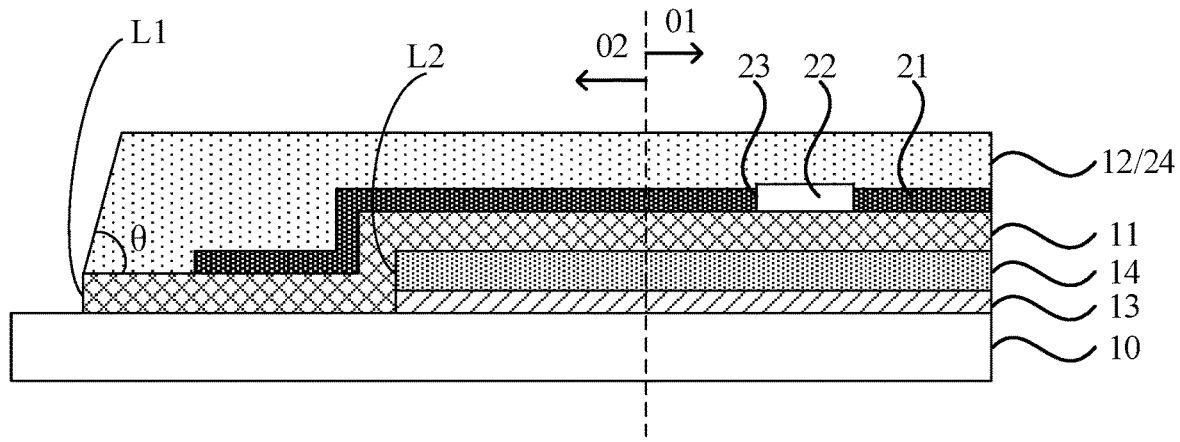
FIG. 19 is a section view of another display panel according to an embodiment of the present disclosure.

FIG. 19 is a section view of another display panel according to an embodiment of the present disclosure. Referring to FIG. 19, the planarization layer 24 includes an organic layer. The planarization layer 24 includes an organic material. In an embodiment, the planarization layer 24 includes a negative organic material, that is, the planarization layer 24 is a negative photoresist. In the direction perpendicular to the substrate 10, the planarization layer 24 has a thickness of about 2 μm and has a tangent structure, and the formed slope angle θ satisfies: θ is greater than 0° and less than 90°. Typically, θ is between 70° and 90°. In the direction perpendicular to the substrate 10, the first insulating film 11 has a thickness of about 0.15 μm. Typically, the thickness is between 0.1 μm and 1 μm. It is to be noted that the surface on a side of the planarization layer adjacent to a cutting edge may be a curved surface or a plane. FIG. 19 merely shows that the surface on the side of the planarization layer adjacent to the cutting edge is a plane.

Figure 20:
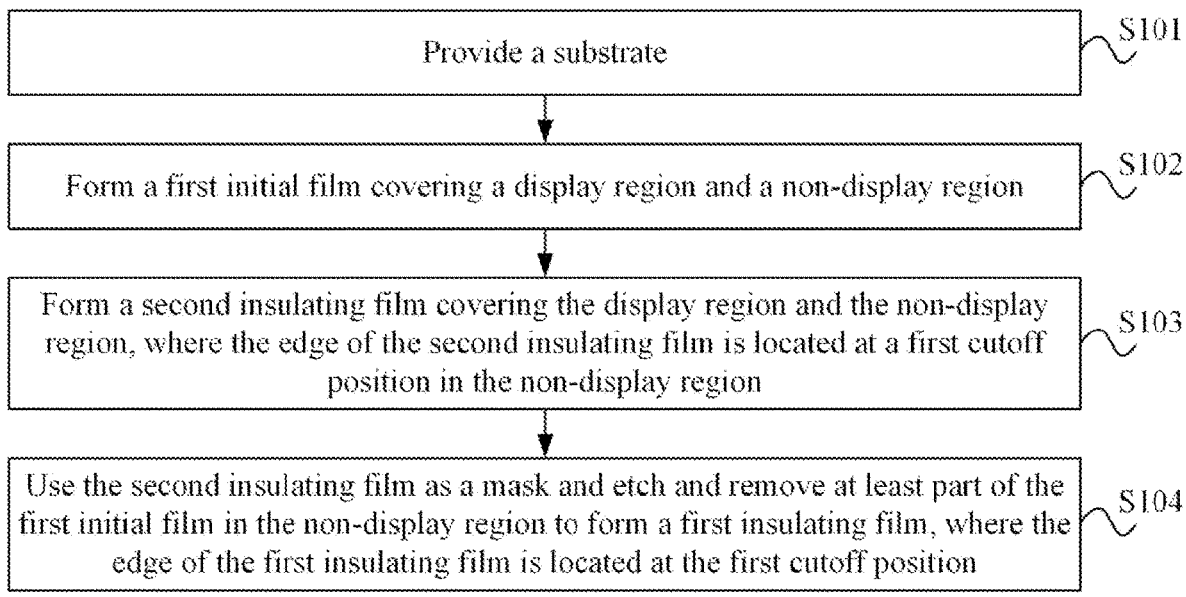
FIG. 20 is a flowchart of a manufacturing method of a display panel according to an embodiment of the present disclosure.

FIG. 20 is a flowchart of a manufacturing method of a display panel according to an embodiment of the present disclosure. FIG. 22 to FIG. 30 are diagrams of the manufacturing process of a display panel according to an embodiment of the present disclosure. Referring to FIG. 20 and FIGS. 22 to 30, the manufacturing method includes the steps below.

In S101, the substrate 10 is provided.

Figure 22:
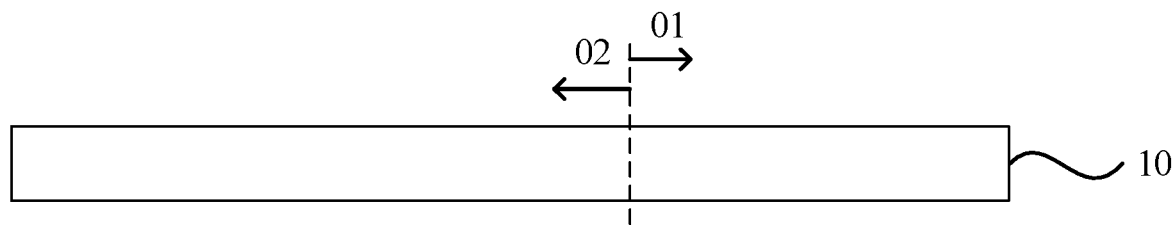
FIG. 22 to FIG. 30 are diagrams of the manufacturing process of a display panel according to an embodiment of the present disclosure.

Referring to FIG. 22, the substrate 10 is provided.

In S102, the first initial film 110 covering the display region 01 and the non-display region 02 is formed.

Figure 26:
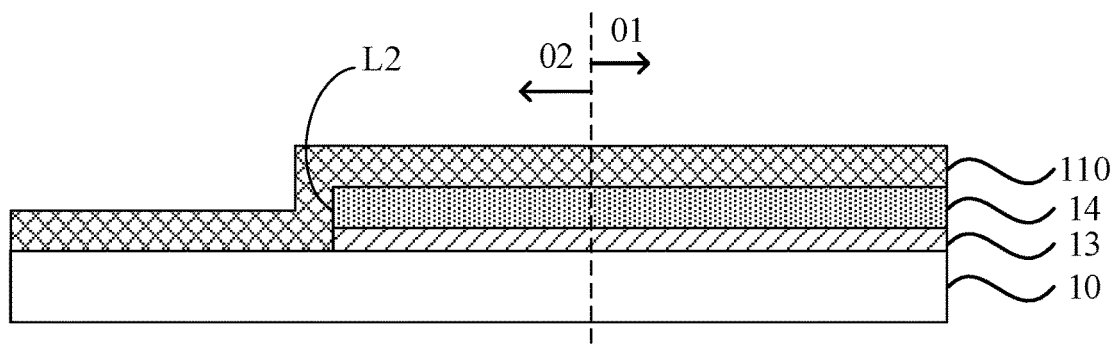

Referring to FIG. 26, the entire first initial film 110 is formed on the substrate 10. The first initial film 110 is located in the display region 01 and the non-display region 02.

In S103, the second insulating film 12 covering the display region 01 and the non-display region 02 is formed. The edge of the second insulating film 12 is located at the first cutoff position L1 in the non-display region 02.

Figure 29:
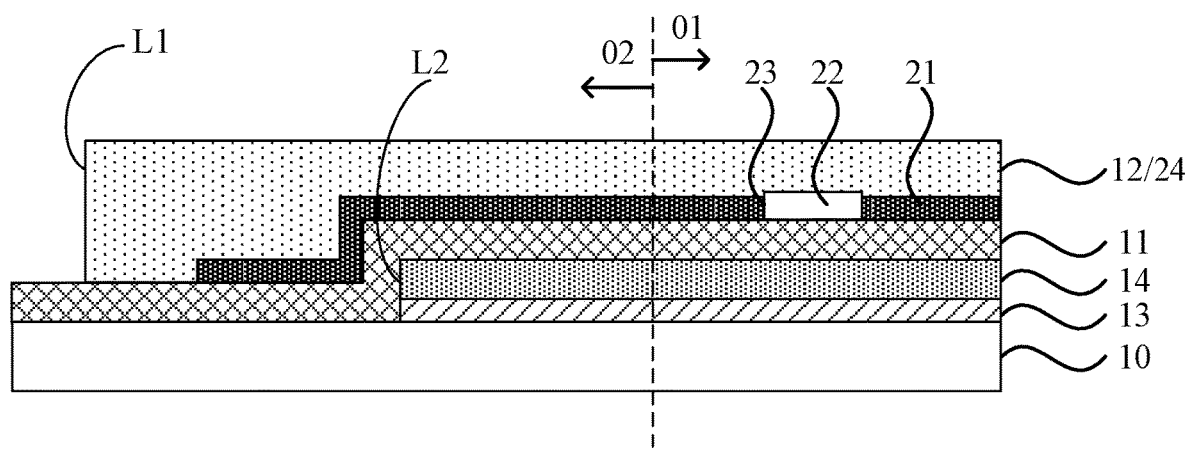

Referring to FIG. 29, the second insulating film 12 is formed on the first initial film 110. The second insulating film 12 is located in the display region 01 and the non-display region 02. The edge of the second insulating film 12 is located at the first cutoff position L1. The second insulating film 12 exposes the first initial film 110 located in a lower layer.

In S104, the second insulating film 12 is used as the mask. At least part of the first initial film 110 in the non-display region 02 is etched and removed to form the first insulating film 11. The edge of the first insulating film 11 is located at the first cutoff position L1.

Figure 30:
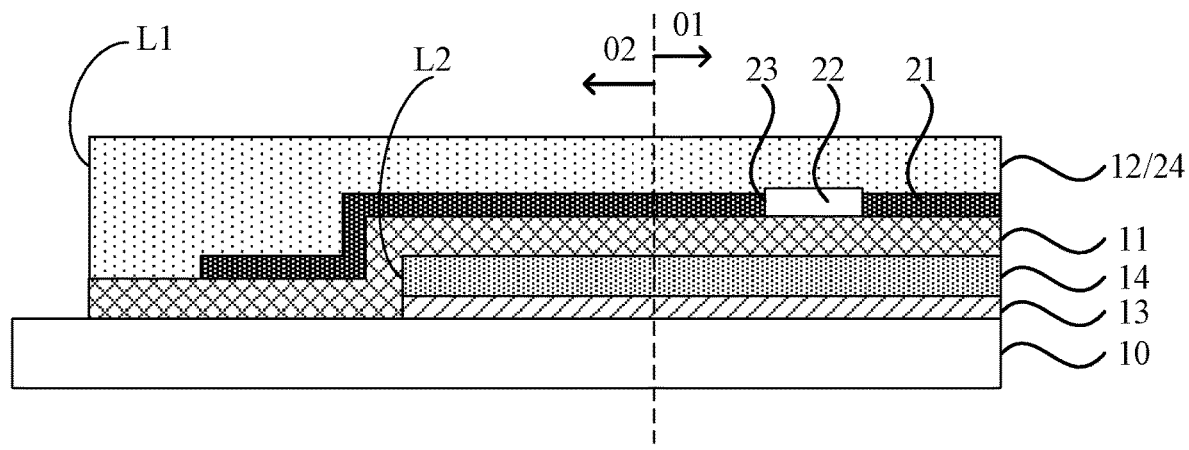

Referring to FIG. 30, the second insulating film 12 is used as the mask to etch the first initial film 110. The first initial film 110 not covered by the second insulating film 12 is etched and removed to form the first insulating film 11. The edge of the first insulating film 11 is located at the first cutoff position L1.

The manufacturing method of a display panel provided by this embodiment of the present disclosure is used to form the display panel in the preceding embodiments. After the first initial film 110 covering the display region 01 and the non-display region 02 is formed, the first initial film 110 is not etched, but the second insulating film 12 is formed on the first initial film 110, and the second insulating film 12 is used as the mask for etching the first initial film 110. Thus, there is no need to specially manufacture a mask when the first initial film 110 is etched, so that a process is saved, and the process flow of the display panel in the manufacturing process is reduced. Moreover, the production capacity of the display panel is improved, and the manufacturing cost of the display panel is reduced.

Figure 21:
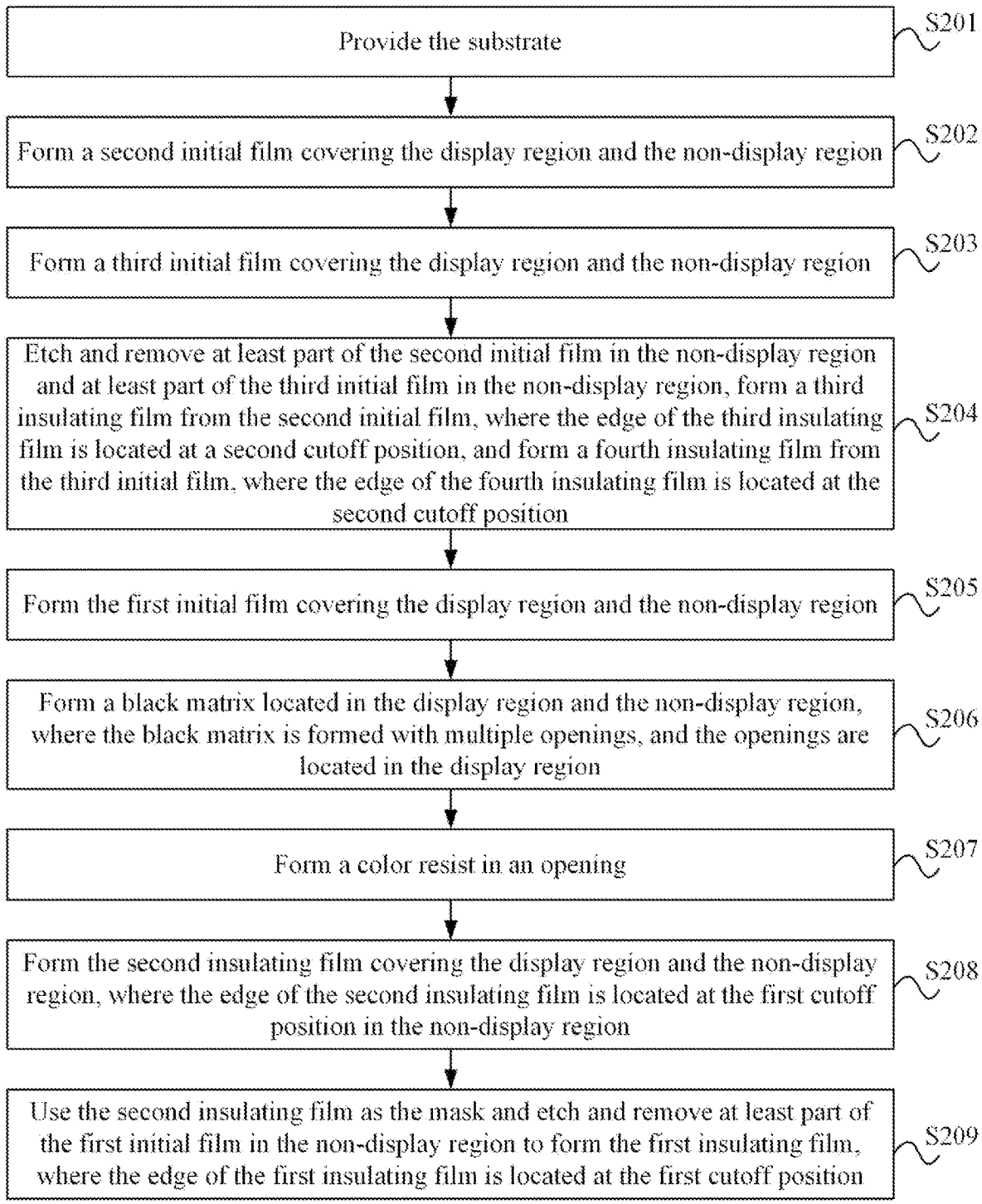
FIG. 21 is a flowchart of a manufacturing method of a display panel according to an embodiment of the present disclosure.

FIG. 21 is a flowchart of a manufacturing method of a display panel according to an embodiment of the present disclosure. FIG. 22 to FIG. 30 are diagrams of the manufacturing process of a display panel according to an embodiment of the present disclosure. Referring to FIGS. 21 to 30, the manufacturing method includes the steps below.

In S201, the substrate 10 is provided.

In S202, the second initial film 130 covering the display region 01 and the non-display region 02 is formed.

Figure 23:
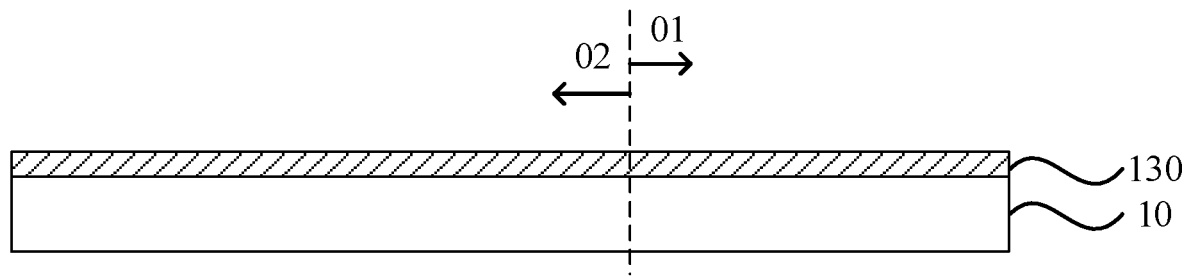

Referring to FIG. 23, the entire second initial film 130 is formed on the substrate 10. The second initial film 130 is located in the display region 01 and the non-display region 02.

In S203, a third initial film 140 covering the display region 01 and the non-display region 02 is formed.

Figure 24:
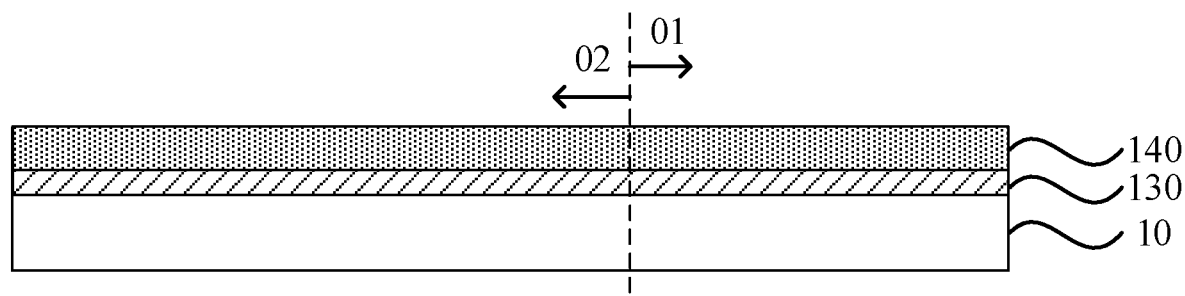

Referring to FIG. 24, the entire third initial film 140 is formed on the substrate 10. The third initial film 140 is located in the display region 01 and the non-display region 02.

In S204, at least part of the second initial film 130 in the non-display region 02 and at least part of the third initial film 140 in the non-display region 02 are etched and removed. The third insulating film 13 is formed from the second initial film 130. The edge of the third insulating film 13 is located at the second cutoff position L2. The fourth insulating film 14 is formed from the third initial film 140. The edge of the fourth insulating film 14 is located at the second cutoff position L2.

Figure 25:
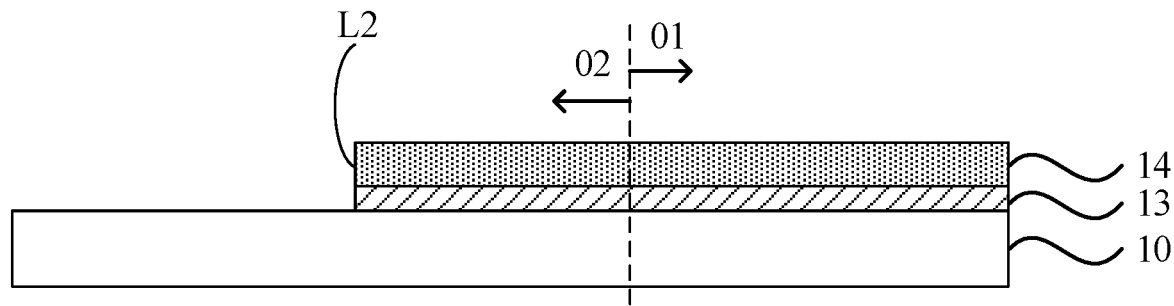

Referring to FIG. 25, the second initial film 130 is etched to form the third insulating film 13. The third initial film 140 is etched to form the fourth insulating film 14. The edge of the third insulating film 13 and the edge of the fourth insulating film 14 are each located at the second cutoff position L2.

In an embodiment, each of the third insulating film 13 and the fourth insulating film 14 includes an inorganic layer. Alternatively, each of the third insulating film 13 and the fourth insulating film 14 includes an organic layer. During the manufacturing process of the display panel, the same etching method may be used for the third insulating film 13 and the fourth insulating film 14 of the same material type. For example, dry etching is used for an inorganic layer, and wet etching is used for an inorganic layer. In this manner, during the manufacturing process of the display panel, the same mask is used, and in the same process, the third insulating film 13 and the fourth insulating film 14 are simultaneously formed, so that a process is saved.

In S205, the first initial film 110 covering the display region 01 and the non-display region 02 is formed.

In S206, the black matrix 21 located in the display region 01 and the non-display region 02 is formed. The black matrix 21 is formed with multiple openings 23. The openings 23 are located in the display region 01.

Figure 27:
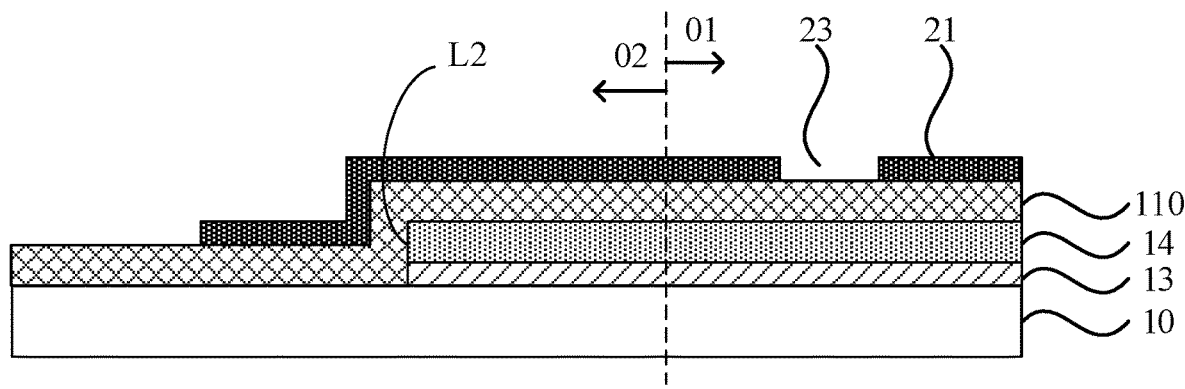

Referring to FIG. 27, the black matrix 21 is formed. The black matrix 21 is formed with the openings 23 in the display region 01.

In S207, a color resist 22 is formed in an opening 23.

Figure 28:
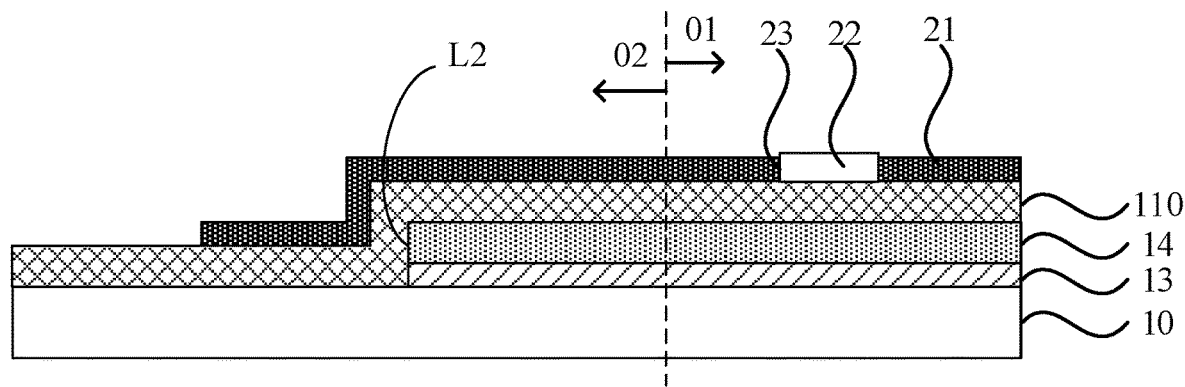

Referring to FIG. 28, the color resists 22 are formed in the openings 23.

In S208, the second insulating film 12 covering the display region 01 and the non-display region 02 is formed. The edge of the second insulating film 12 is located at the first cutoff position L1 in the non-display region 02.

Referring to FIG. 29, the second insulating film 12 is formed on the black matrix 21 and the color resist 22. The edge of the second insulating film 12 is located at the first cutoff position L1. The second insulating film 12 is the planarization layer 24. The second insulating film 12 covers the edge of the black matrix 21 to prevent vapor and oxygen from entering the display region 01 of the display panel from the edge of the black matrix 21.

In an embodiment, the second cutoff position L2 is located between the first cutoff position L1 and the display region 01.

In S209, the second insulating film 12 is used as the mask. At least part of the first initial film 110 in the non-display region 02 is etched and removed to form the first insulating film 11. The edge of the first insulating film 11 is located at the first cutoff position L1.

In the manufacturing method of a display panel provided by this embodiment of the present disclosure, on the basis of the preceding embodiments, the black matrix 21 and the color resists 22 are formed between the first insulating film 11 and the second insulating film 12, and the planarization layer 24 is used as the second insulating film 12. The second insulating film 12 is used as the mask to etch the first initial film 110 to form the first insulating film 11. Additionally, in this embodiment of the present disclosure, after the second initial film 130 covering the display region 01 and the non-display region 02 is formed, the second initial film 130 is not etched, but the third initial film 140 is formed on the second initial film 130, and then the second initial film 130 and the third initial film 140 are etched. In this manner, there is no need to specially manufacture a mask when the second initial film 130 is etched, so that a process is saved, and the process flow of the display panel in the manufacturing process is reduced. Moreover, the production capacity of the display panel is improved, and the manufacturing cost of the display panel is reduced.

It is to be understood that when the second initial film 130 and the third initial film 140 are etched, since the third initial film 140 covers the second initial film 130, the third initial film 140 is first etched to form the fourth insulating film 14. Then the second initial film 130 is etched to form the third insulating film 13.

In an embodiment, the first insulating film 11 is an inorganic layer, and the second insulating film 12 is an organic layer. The organic layer may be regarded as a photoresist. The etching process of the organic layer is the developing process of the organic layer. The patterning process of the organic layer includes exposing under a mask and then etching (that is, developing). The patterning process of the inorganic layer includes performing dry etching under a mask, for example, ion etching.

Figure 31:
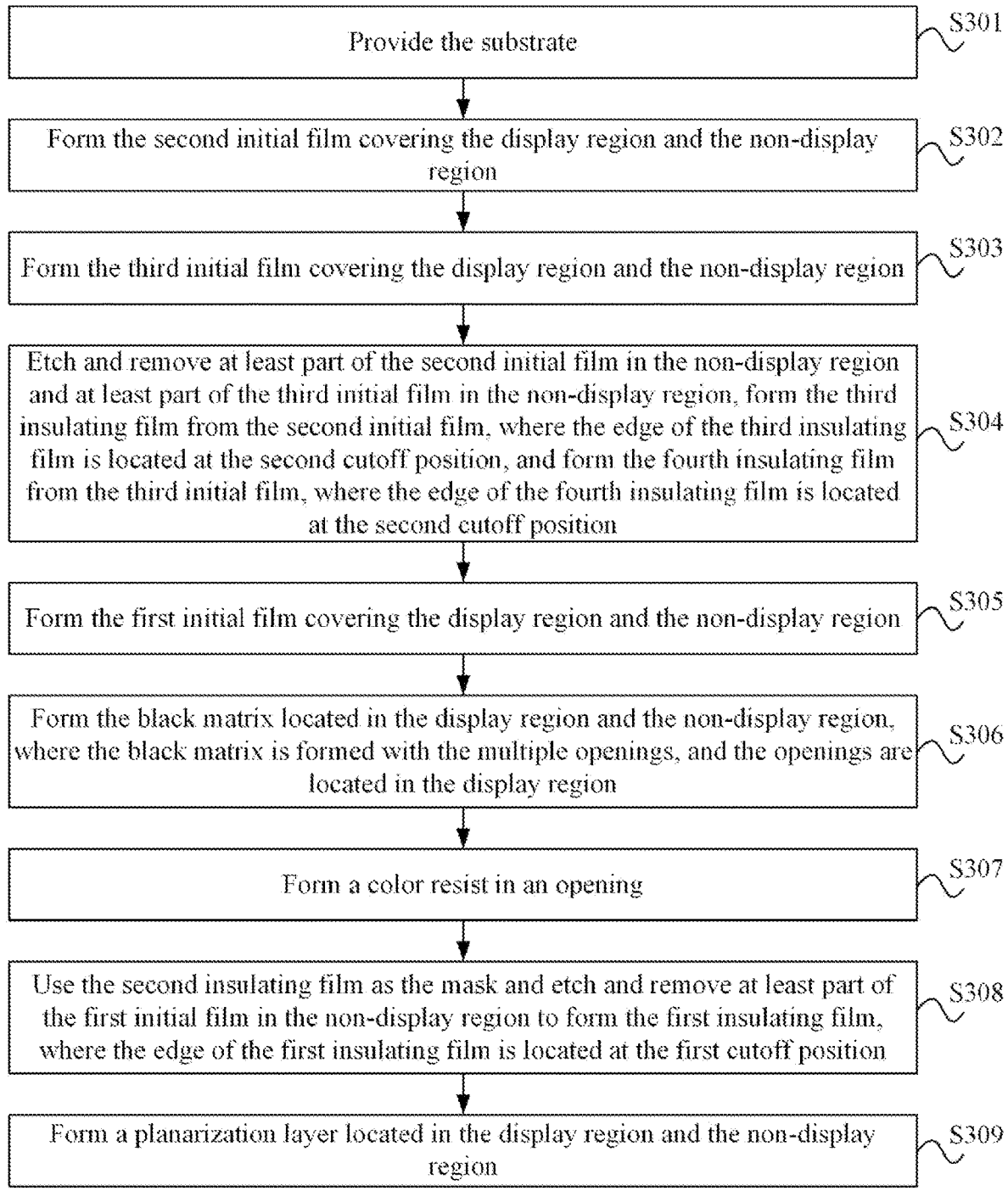
FIG. 31 is a flowchart of a manufacturing method of another display panel according to an embodiment of the present disclosure.
Figure 40:
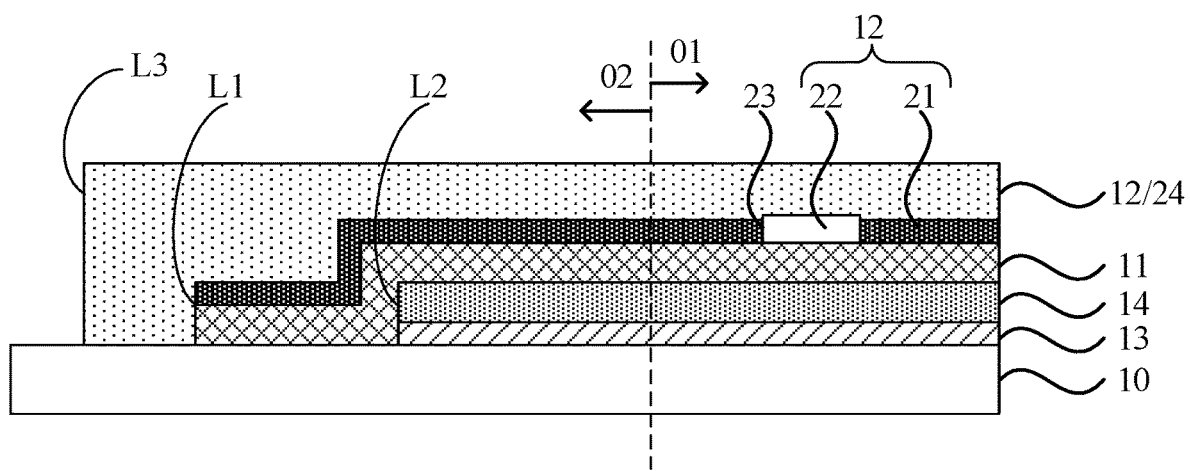

FIG. 31 is a flowchart of a manufacturing method of another display panel according to an embodiment of the present disclosure. FIG. 32 to FIG. 40 are diagrams of the manufacturing process of another display panel according to an embodiment of the present disclosure. Referring to FIGS. 31 and 40, the manufacturing method includes the steps below.

In S301, the substrate 10 is provided.

Figure 32:
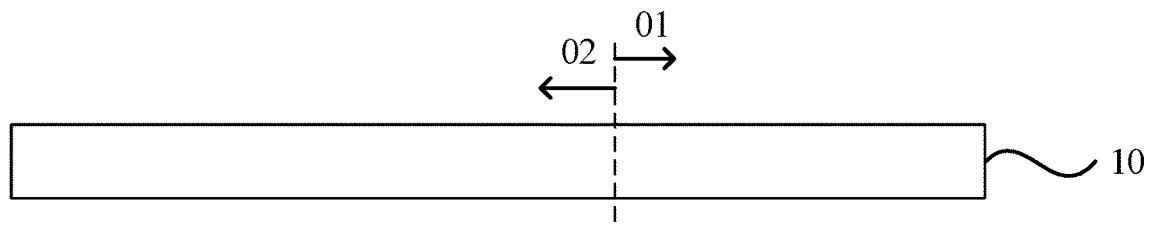
FIG. 32 to FIG. 40 are diagrams of the manufacturing process of another display panel according to an embodiment of the present disclosure.

Referring to FIG. 32, the substrate 10 is provided.

In S302, the second initial film 130 covering the display region 01 and the non-display region 02 is formed.

Figure 33:
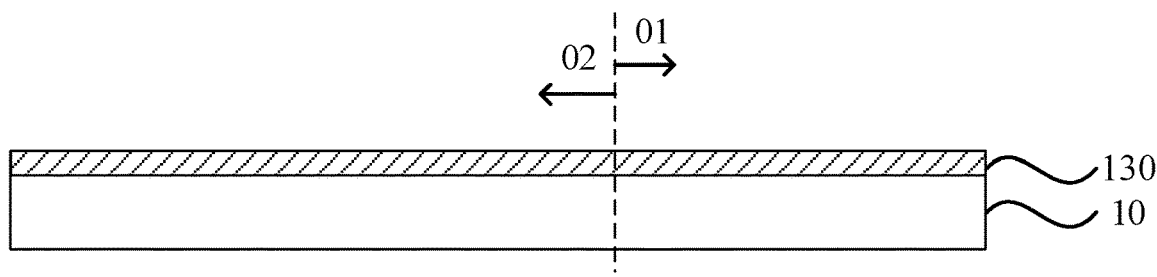

Referring to FIG. 33, the entire second initial film 130 is formed on the substrate 10. The second initial film 130 is located in the display region 01 and the non-display region 02.

In S303, the third initial film 140 covering the display region 01 and the non-display region 02 is formed.

Figure 34:
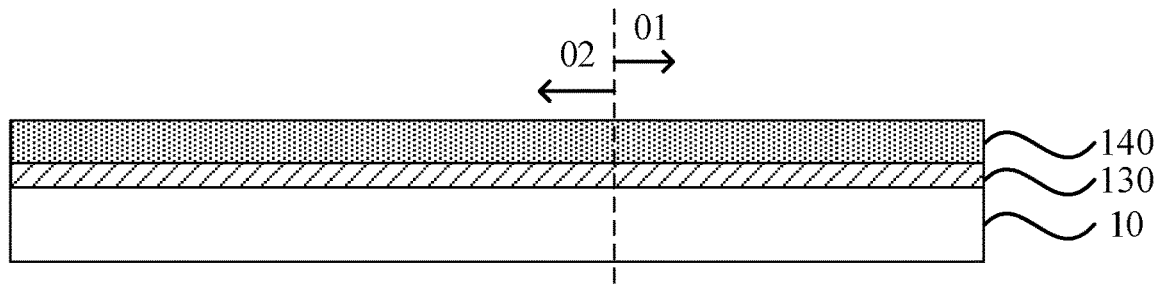

Referring to FIG. 34, the entire third initial film 140 is formed on the substrate 10. The third initial film 140 is located in the display region 01 and the non-display region 02.

In S304, at least part of the second initial film 130 in the non-display region 02 and at least part of the third initial film 140 in the non-display region 02 are etched and removed. The third insulating film 13 is formed from the second initial film 130. The edge of the third insulating film 13 is located at the second cutoff position L2. The fourth insulating film 13 is formed from the third initial film 140. The edge of the fourth insulating film 13 is located at the second cutoff position L2.

Figure 35:
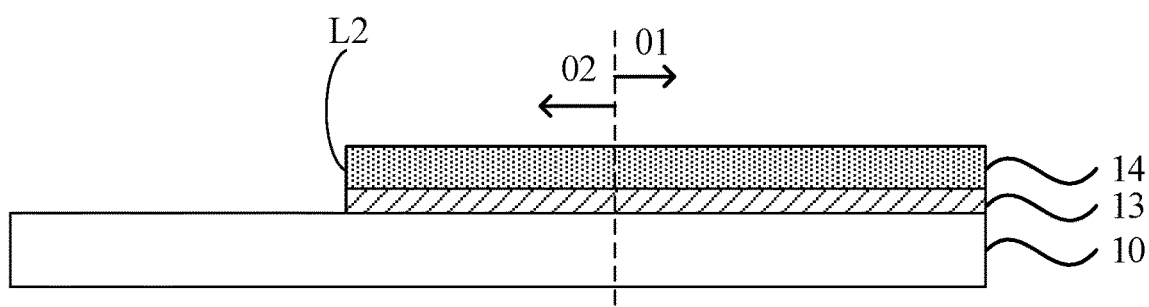

Referring to FIG. 35, the second initial film 130 is etched to form the third insulating film 13. The third initial film 140 is etched to form the fourth insulating film 14. The edge of the third insulating film 13 and the edge of the fourth insulating film 14 are each located at the second cutoff position L2.

In S305, the first initial film 110 covering the display region 01 and the non-display region 02 is formed.

Figure 36:
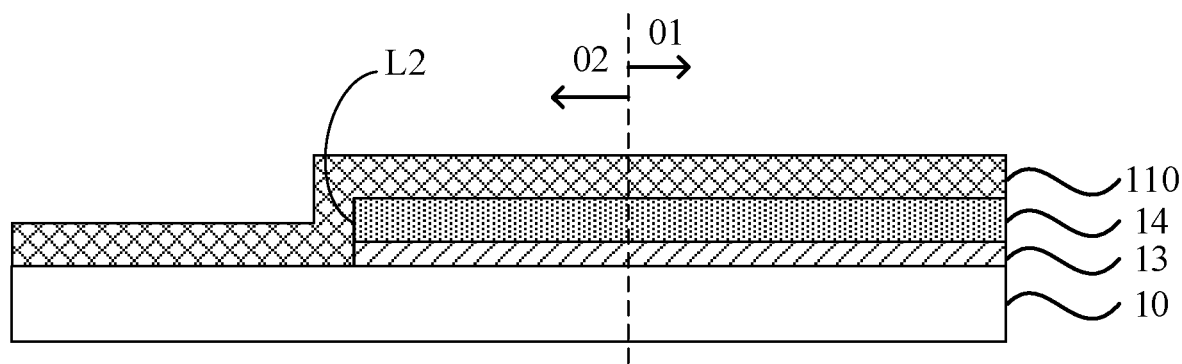

Referring to FIG. 36, the entire first initial film 110 is formed on the substrate 10. The first initial film 110 is located in the display region 01 and the non-display region 02.

In S306, the black matrix 21 located in the display region 01 and the non-display region 02 is formed. The black matrix 21 is formed with multiple openings 23. The openings 23 are located in the display region 01.

Figure 37:
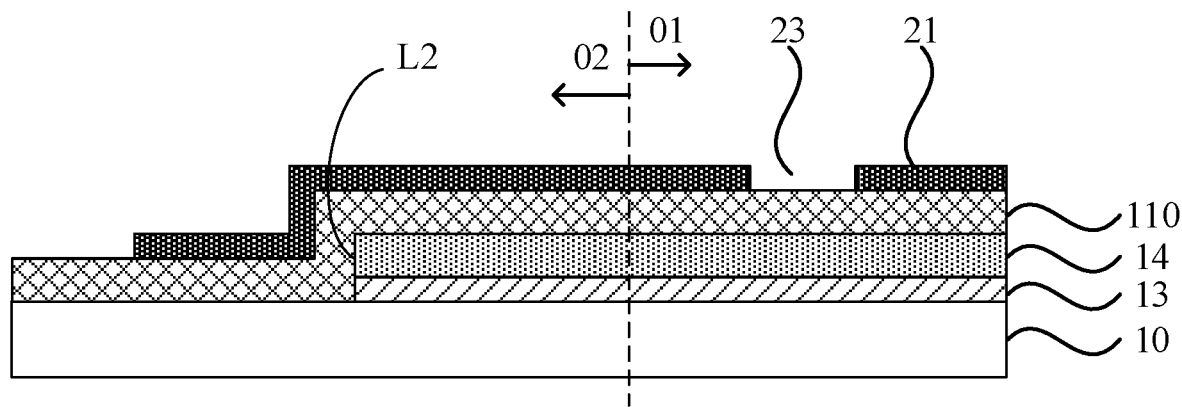

Referring to FIG. 37, the black matrix 21 is formed. The black matrix 21 is formed with the openings 23 in the display region 01.

In S307, a color resist 22 is formed in an opening 23.

Figure 38:
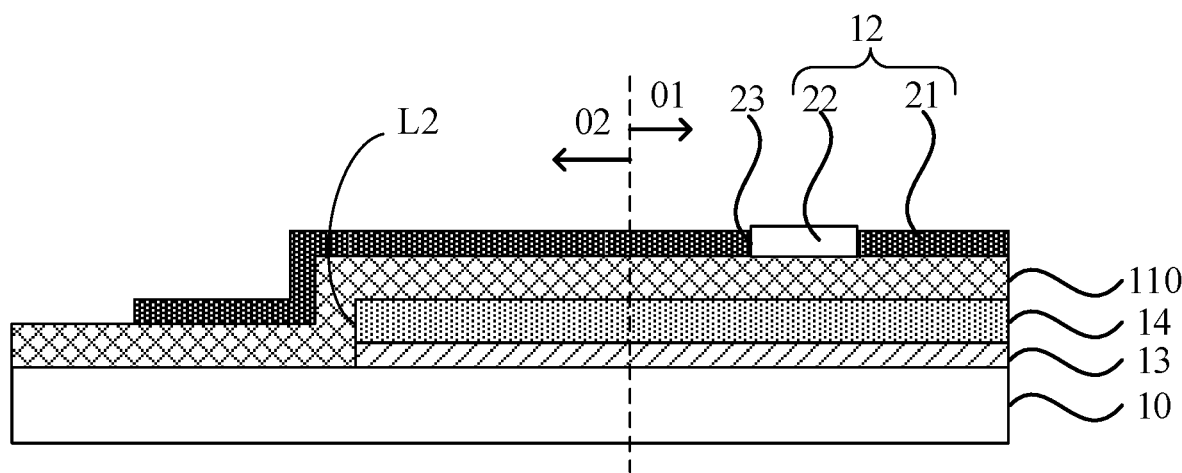
Figure 39:
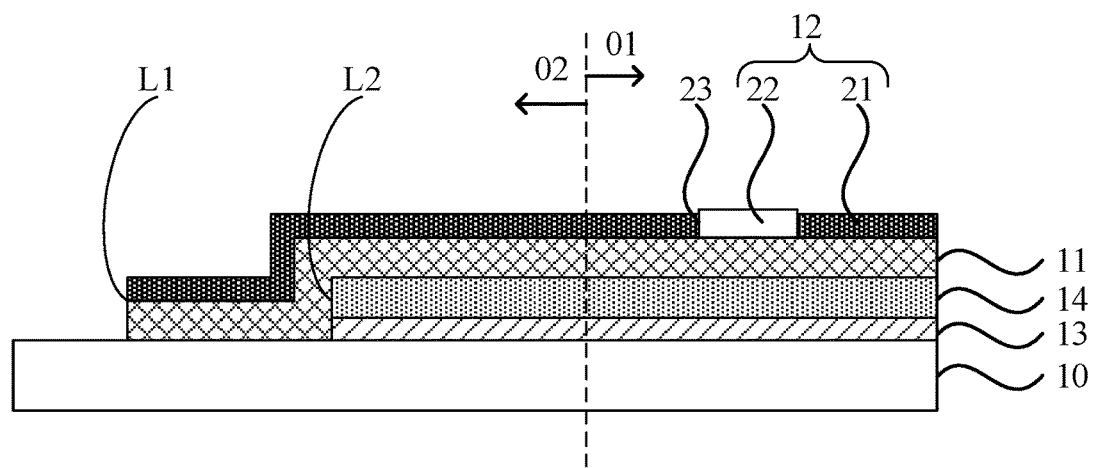

Referring to FIG. 38, the color resists 22 are formed in the openings 23.

In S308, the second insulating film 12 is used as the mask. At least part of the first initial film 110 in the non-display region 02 is etched and removed to form the first insulating film 11. The edge of the first insulating film 11 is located at the first cutoff position L1.

The combined structure formed by the black matrix 21 and the multiple color resists 22 is used as the second insulating film 12. The second insulating film 12 is used as the mask. The first initial film 110 is etched to form the first insulating film 11.

In S309, the planarization layer 24 located in the display region 01 and the non-display region 02 is formed.

Referring to FIG. 40, the planarization layer 24 is formed on the black matrix 21 and the color resist 22.

In an embodiment, the edge of the planarization layer 24 is located at the third cutoff position L3 in the non-display region 02. The first cutoff position L1 is located between the third cutoff position L3 and the display region 01.

In the manufacturing method of a display panel provided by this embodiment of the present disclosure, on the basis of the preceding embodiments, the black matrix 21 and the color resist 22 are formed on the first initial film 110, and the combined structure formed by the black matrix 21 and the multiple color resists 22 is used as a mask to etch the first initial film 110 to form the first insulating film 11.

In an embodiment, referring to FIG. 10, FIG. 12, FIGS. 22 to 30, and FIGS. 32 to 40, before the second initial film 130 covering the display region 01 and the non-display region 02 is formed, the manufacturing method also includes the steps below.

The display function layer 25 located in the display region 01 is formed.

The thin-film encapsulation layer 26 in the display region 01 and the non-display region 02 is formed.

The edge of an inorganic layer in the thin-film encapsulation layer 26 is located at the fourth cutoff position L4 in the non-display region 02. The fourth cutoff position L4 is located between the second cutoff position L2 and the display region 01.

In an embodiment, referring to FIG. 16, FIGS. 22 to 30, and FIGS. 32 to 40, before the third initial film 140 covering the display region 01 and the non-display region 02 is formed, the manufacturing method also includes the steps below.

The first touch metal layer 31 is formed.

After at least part of the second initial film 130 in the non-display region 02 and at least part of the third initial film 140 in the non-display region 02 are etched and removed, the third insulating film 13 is formed from the second initial film 130, where the edge of the third insulating film 13 is located at the second cutoff position L2, and the fourth insulating film 14 is formed from the third initial film 140, where the edge of the fourth insulating film 14 is located at the second cutoff position L2, the manufacturing method also includes the steps below.

The second touch metal layer 32 is formed.

Figure 41:
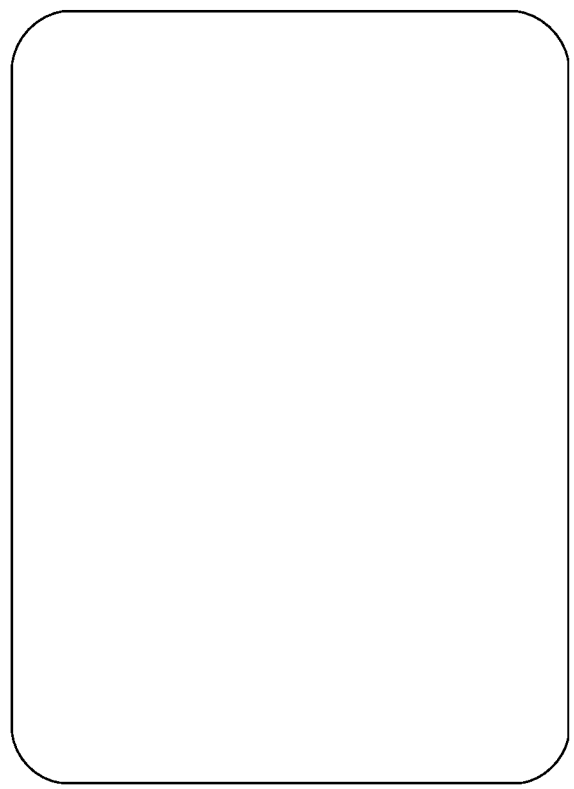
FIG. 41 is a diagram of a display device according to an embodiment of the present disclosure.

An embodiment of the present disclosure provides a display device. FIG. 41 is a diagram of a display device according to an embodiment of the present disclosure. Referring to FIG. 41, the display device includes any display panel provided in embodiments of the present disclosure. The display device may be a mobile phone, a tablet computer, and a smart wearable device.

It is to be noted that the preceding are only preferred embodiments of the present disclosure and the technical principles used therein. It is to be understood by those skilled in the art that the present disclosure is not limited to the embodiments described herein. For those skilled in the art, various apparent modifications, adaptations, combinations, and substitutions can be made without departing from the scope of the present disclosure. Therefore, while the present disclosure is described in detail in connection with the preceding embodiments, the present disclosure is not limited to the preceding embodiments and may include equivalent embodiments without departing from the concept of the present disclosure. The scope of the present disclosure is determined by the scope of the appended claims.

What is claimed is:

1. A display panel, comprising a display region and a non-display region, wherein the non-display region is located at a periphery of the display region, and the display panel comprising:
    a substrate;
    a first insulating film located in the display region and the non-display region and located on a side of the substrate, wherein an edge of the first insulating film is located at a first cutoff position in the non-display region;
    a second insulating film located in the display region and the non-display region and located on a side of the first insulating film facing away from the substrate, wherein an edge of the second insulating film is located at the first cutoff position;
    a black matrix located in the display region and the non-display region, wherein the black matrix is formed with a plurality of openings, and the plurality of openings are located in the display region; and
    a plurality of color resists, wherein the plurality of color resists are located in the plurality of openings;
    wherein the black matrix and the plurality of color resists are located between the first insulating film and the second insulating film.

2. The display panel according to claim 1, further comprising:
    a third insulating film located in the display region and the non-display region and located between the first insulating film and the substrate, wherein an edge of the third insulating film is located at a second cutoff position in the non-display region; and
    a fourth insulating film located in the display region and the non-display region and located between the third insulating film and the first insulating film, wherein an edge of the fourth insulating film is located at the second cutoff position.

3. The display panel according to claim 2, wherein the second cutoff position is located between the first cutoff position and the display region.

4. The display panel according to claim 1, wherein the first insulating film comprises an inorganic layer, and the second insulating film comprises an organic layer.

5. The display panel according to claim 1, further comprising:
    a display function layer located in the display region and located between the substrate and the first insulating film; and
    a driver circuit layer located in the display region and the non-display region, wherein an inorganic layer in the driver circuit layer is further formed with a plurality of grooves in the non-display region, and a region in which the plurality of grooves are located is a groove region;
    wherein the groove region is located between the first cutoff position and the display region.

6. A display panel, comprising a display region and a non-display region, wherein the non-display region is located at a periphery of the display region, and the display panel comprising:
    a substrate;
    a first insulating film located in the display region and the non-display region and located on a side of the substrate, wherein an edge of the first insulating film is located at a first cutoff position in the non-display region; and a second insulating film located in the display region and the non-display region and located on a side of the first insulating film facing away from the substrate, wherein an edge of the second insulating film is located at the first cutoff position;
wherein the second insulating film comprises a black matrix and a plurality of color resists; and
the black matrix is located in the display region and the non-display region, wherein the black matrix is formed with a plurality of openings, the plurality of openings are located in the display region, and the plurality of color resists are located in the plurality of openings.

7. The display panel according to claim 6, further comprising:
a planarization layer located in the display region and the non-display region and located on a side of the second insulating film facing away from the substrate; wherein an edge of the planarization layer is located at a third cutoff position in the non-display region; and
the first cutoff position is located between the third cutoff position and the display region.

8. The display panel according to claim 6, further comprising:
a display function layer located in the display region and located between the substrate and the first insulating film; and
a driver circuit layer located in the display region and the non-display region, wherein an inorganic layer in the driver circuit layer is further formed with a plurality of grooves in the non-display region, and a region in which the plurality of grooves are located is a groove region; and
the first cutoff position is located in the groove region.

9. The display panel according to claim 2, further comprising:
a display function layer located in the display region and located between the substrate and the third insulating film; and
a thin-film encapsulation layer located in the display region and the non-display region and located between the display function layer and the third insulating film, wherein an edge of an inorganic layer in the thin-film encapsulation layer is located at a fourth cutoff position in the non-display region; and
the fourth cutoff position is located between the second cutoff position and the display region.

10. The display panel according to claim 2, wherein the first cutoff position is located between the second cutoff position and the display region;
wherein a region between the first cutoff position and the second cutoff position is an over-etching region; and
in a direction perpendicular to a plane in which the substrate is located, a sum of a thickness of the third insulating film in the over-etching region and a thickness of the fourth insulating film in the over-etching region is D1, and a sum of a thickness of the third insulating film in the display region and a thickness of the fourth insulating film in the display region is D2, wherein D1 is smaller than D2.

11. The display panel according to claim 2, further comprising:
a first touch metal layer located between the third insulating film and the fourth insulating film; and
a second touch metal layer located between the fourth insulating film and the first insulating film.

12. A manufacturing method of a display panel, wherein the display panel comprises a display region and a non-display region, and the non-display region is located at a periphery of the display region; and the manufacturing method comprises:
providing a substrate;
forming a first initial film covering the display region and the non-display region;
forming a second insulating film covering the display region and the non-display region, wherein an edge of the second insulating film is located at a first cutoff position in the non-display region; and
using the second insulating film as a mask and etching and removing at least part of the first initial film in the non-display region to form a first insulating film, wherein an edge of the first insulating film is located at the first cutoff position.

13. The manufacturing method according to claim 12, before forming the first initial film covering the display region and the non-display region, further comprising:
forming a second initial film covering the display region and the non-display region;
forming a third initial film covering the display region and the non-display region; and
etching and removing at least part of the second initial film in the non-display region and at least part of the third initial film in the non-display region, forming a third insulating film from the second initial film, wherein an edge of the third insulating film is located at a second cutoff position, and forming a fourth insulating film from the third initial film, wherein an edge of the fourth insulating film is located at the second cutoff position.

14. The manufacturing method according to claim 13, wherein the second cutoff position is located between the first cutoff position and the display region.

15. The manufacturing method according to claim 12, wherein the first insulating film is an inorganic layer, and the second insulating film is an organic layer.

16. The manufacturing method according to claim 12, before forming the second insulating film covering the display region and the non-display region, wherein the edge of the second insulating film is located at the first cutoff position in the non-display region, further comprising:
forming a black matrix located in the display region and the non-display region, wherein the black matrix is formed with a plurality of openings, and the plurality of openings are located in the display region; and
forming color resists in the plurality of openings.

17. The manufacturing method according to claim 12, wherein forming the second insulating film covering the display region and the non-display region, wherein the edge of the second insulating film is located at the first cutoff position in the non-display region, comprises:
forming a black matrix located in the display region and the non-display region, wherein the black matrix is formed with a plurality of openings, and the openings are located in the display region; and
forming color resists in the plurality of openings;
wherein after using the second insulating film as the mask and etching and removing the at least part of the first initial film in the non-display region to form the first insulating film, wherein the edge of the first insulating film is located at the first cutoff position, the method further comprises:
forming a planarization layer located in the display region and the non-display region;
wherein an edge of the planarization layer is located at a third cutoff position in the non-display region; and the first cutoff position is located between the third cutoff position and the display region.

18. The manufacturing method according to claim 13, before forming the second initial film covering the display region and the non-display region, further comprising:
   forming a display function layer located in the display region; and
   forming a thin-film encapsulation layer located in the display region and the non-display region, wherein
   an edge of an inorganic layer in the thin-film encapsulation layer is located at a fourth cutoff position in the non-display region; and the fourth cutoff position is located between the second cutoff position and the display region.

19. The manufacturing method according to claim 13, before forming the third initial film covering the display region and the non-display region, further comprising:
   forming a first touch metal layer; and
   after etching and removing the at least part of the second initial film in the non-display region and the at least part of the third initial film in the non-display region, forming the third insulating film from the second initial film, wherein the edge of the third insulating film is located at the second cutoff position, and forming the fourth insulating film from the third initial film, wherein the edge of the fourth insulating film is located at the second cutoff position, further comprising:
   forming a second touch metal layer.

20. A display device, comprising the display panel according to claim 1.

* * * * *